(12) United States Patent
Okada et al.

(10) Patent No.: US 8,090,036 B2
(45) Date of Patent: Jan. 3, 2012

(54) TRANSMITTER AND CARRIER LEAK DETECTION METHOD

(75) Inventors: Takashi Okada, Kodaira (JP); Takahiro Todate, Kodaira (JP); Yasuhiro Takeuchi, Kodaira (JP); Takashi Okazaki, Kodaira (JP); Masaharu Chiba, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 737 days.

(21) Appl. No.: 12/223,462

(22) PCT Filed: Feb. 26, 2007

(86) PCT No.: PCT/JP2007/054112
§ 371 (c)(1),
(2), (4) Date: Jul. 31, 2008

(87) PCT Pub. No.: WO2007/100114
PCT Pub. Date: Sep. 7, 2007

(65) Prior Publication Data
US 2009/0161778 A1      Jun. 25, 2009

(30) Foreign Application Priority Data

Mar. 1, 2006 (JP) ................................. 2006-054353
Jun. 19, 2006 (JP) ................................. 2006-168436

(51) Int. Cl.
*H04K 1/10* (2006.01)
(52) U.S. Cl. ........ 375/260; 375/296; 375/346; 375/226; 375/261; 455/113; 455/126; 455/127.2
(58) Field of Classification Search .................. 375/260, 375/296, 261, 226, 346; 327/307; 455/127.2, 455/113, 126
See application file for complete search history.

(56) References Cited

U.S. PATENT DOCUMENTS 5,574,994 A * 11/1996 Huang et al. .................. 455/126
(Continued)

FOREIGN PATENT DOCUMENTS
JP      62-145904         6/1987
(Continued)

OTHER PUBLICATIONS

International Search Report issued Mar. 20, 2007 in the International (PCT) Application of which the present application is the U.S. National Stage.
(Continued)

*Primary Examiner* — Eva Puente
(74) *Attorney, Agent, or Firm* — Wenderoth, Lind & Ponack, LLP

(57) ABSTRACT

A carrier leak compensating device (2) for adding compensation values to a received transmission signal, an analog quadrature modulator (4), a feedback device (5-7) for receiving and quadrature-detecting part of an output signal of the analog quadrature modulator and outputting a feedback signal in which the frequency of each carrier signal is the same as in the transmission signal, a carrier leak detecting device (800) for detecting an I-phase carrier leak and a Q-phase carrier leak on the basis of the difference between cumulative addition values of an amplitude/phase-adjusted feedback signal and the transmission signal, and a carrier leak compensation value controller (9) for updating the compensation values on the basis of the detected carrier leak. The number of samples for the amplitude/phase detection may be smaller than the number of cumulative addition samples.

5 Claims, 15 Drawing Sheets

U.S. PATENT DOCUMENTS

| | | |
|---|---|---|
| 2004/0137856 A1 | 7/2004 | Kanazawa et al. |
| 2004/0250192 A1 | 12/2004 | Kanazawa |
| 2010/0039158 A1* | 2/2010 | Ohba et al. ................... 327/307 |
| 2010/0195706 A1* | 8/2010 | Yanagisawa et al. ......... 375/226 |
| 2010/0239056 A1* | 9/2010 | Matsuno et al. ............... 375/346 |
| 2010/0273439 A1* | 10/2010 | Kawai ............................ 455/113 |
| 2010/0317303 A1* | 12/2010 | Kuo et al. ................... 455/127.2 |

FOREIGN PATENT DOCUMENTS

| | | |
|---|---|---|
| JP | 5-22356 | 1/1993 |
| JP | 8-321815 | 12/1996 |
| JP | 10-136048 | 5/1998 |
| JP | 11-27331 | 1/1999 |
| JP | 11-88454 | 3/1999 |
| JP | 2001-7869 | 1/2001 |
| JP | 2001-16283 | 1/2001 |
| JP | 2001-339452 | 12/2001 |
| JP | 2002-7285 | 1/2002 |
| JP | 2002-164947 | 6/2002 |
| JP | 2002-208979 | 7/2002 |
| JP | 2004-221653 | 8/2004 |
| JP | 2004-222259 | 8/2004 |
| JP | 2004-363757 | 12/2004 |
| JP | 2006-50331 | 2/2006 |
| JP | 2006-115463 | 4/2006 |
| WO | 03/101061 | 12/2003 |

OTHER PUBLICATIONS

"*Affine Transformation of Linear Distortion Compensation—an Application to Linear Signalling with Equalization in Mobile Radio*", The Institute of Electronics, Information and Communication Engineers, vol. J75-BII, No. 1, pp. 1-128, Jan. 25, 1992.

Notice of Reasons for Rejection (in English language) issued Sep. 2, 2008.

* cited by examiner

| Number of cumulative addition samples | Signal component average value | |
|---|---|---|
| | +5[MHz] | 0[MHz] |
| 100 | −184 | −1401 |
| 500 | −15 | −1175 |
| 1000 | −1 | −1147 |
| 5000 | 4 | −38 |
| 10000 | 0 | −37 |
| 50000 | 0 | −21 |
| 100000 | 0 | −46 |

※ Maximum signal amplitude is 16 bits

Fig.9

| Number of cumulative addition samples | Processing time taken to update carrier leak compensation value (ms) | |
|---|---|---|
| | Without cumulative adding means | With cumulative adding means |
| 4096 | 80 | 20.04 |
| 8192 | 160 | 20.09 |
| 16384 | 320 | 20.18 |
| 32768 | 640 | 20.36 |
| 65536 | 1280 | 20.71 |
| 131072 | 2560 | 21.42 |

Fig.10

(a) Center frequency fc
701a
702a
f1a f2a (b) Center frequency fc
701b
702b
f1b f2b In case (a), f1a + f2a ≠ 0 (f1a ≠ f2a) holds.
In case (b), f1b + f2b = 0 (f1b ≠ f2b) holds.

Simulation result of distortion detection value φTX of transmission signal

| Number of cumulative addition samples | (a) Distortion value φTX (°) | (b) Distortion value φTX (°) |
|---|---|---|
| 512 | 0.054 | −3.835 |
| 2048 | −0.031 | −4.307 |
| 8192 | 0.012 | −2.263 |
| 32768 | 0.002 | −1.904 |
| 131072 | 0.000 | 0.868 |
| 524288 | 0.000 | 0.763 |

TRANSMITTER AND CARRIER LEAK DETECTION METHOD

BACKGROUND OF THE INVENTION

1. Technical Field

For example, the present invention relates to a transmitter using an analog quadrature modulator. More particularly, the invention relates to a technique for satisfactorily compensating for a distortion occurring in a transmission signal by detecting a linear distortion before and behind a signal processing section which is or includes an analog quadrature modulator and performing a control so that the difference between the detected distortions, which is regarded as occurring in the signal processing section, is made small (e.g., minimized).

For example, the invention relates to the following techniques.

The invention relates to a transmitter and a carrier leak detection method. More particularly, the invention relates to a transmitter and a carrier leak detection method for radio-transmitting a high-precision quadrature modulated wave by detecting and compensating for a carrier leak occurring when an analog quadrature modulator is used (e.g., first to third embodiments).

The invention also relates to a transmitter or the like using an analog quadrature modulator which radio-transmits a high-precision quadrature modulated wave by compensating for a distortion occurring due to an I-phase/Q-phase gain imbalance occurring between two D/A converters that are provided separately for the I phase and the Q phase (e.g., fourth embodiment).

The invention also relates to a transmitter or the like using an analog quadrature modulator which radio-transmits a high-precision quadrature modulated wave by detecting and compensating for a deviation in orthogonality (e.g., fifth embodiment).

Furthermore, the invention relates to a transmitter or the like which detects and compensates for two or more of errors as mentioned above, that is, a carrier leak (DC offset), an I/Q gain imbalance, and a deviation in orthogonality (e.g., sixth embodiment).

2. Description of the Related Art

For example, in the transmitter of a wireless communications apparatus which performs a wireless communication using W-CDMA (wide-band code division multiple access) or the like, a signal as a transmission subject is quadrature-modulated by using an analog quadrature modulator. However, a distortion occurs in a transmission signal due to a carrier leak, an I/Q gain imbalance, or a deviation in orthogonality. It is necessary to compensate for such a distortion.

This will be described below in more detail.

In the following, "t" represents time and may be information of time itself, a sampling number, or the like.

First, the carrier leak will be described.

In a transmitter used in a mobile communications system of W-CDMA or the like, generation of a carrier leak is unavoidable as long as a signal is processed by using device for processing an analog signal such as a D/A converter or an analog quadrature modulator. D/A converters should output an analog signal of 0 V in response to input digital data "0." However, an adjustment for that purpose is difficult. Even if an adjustment is made, a deviation tends to occur again due to a temperature variation or a variation with age. As a result, an analog DC signal whose level has a non-0-V offset is output in response to digital data "0." This DC component is up-converted to an RF band by the analog quadrature converter and becomes a carrier leak. Furthermore, in the analog quadrature converter, part of a local signal that is input to it leaks so as to be included in a transmission signal, which means generation of a carrier leak. A carrier leak should be compensated for to satisfy a spurious standard. Even if a carrier leak is within a modulated wave band, it is a factor in deteriorating the signal quality. Therefore, a carrier leak should be compensated for correctly even during operation (refer to Patent documents 1-8, for example).

FIG. 1 shows the configuration of a conventional transmitter with carrier leak compensation.

A digital modulating means 1 performs bandwidth limitation and digital quadrature modulation to respective carrier frequencies on input baseband signals and combines resulting signals. The digital modulating means 1 thus outputs a first IF (intermediate frequency) multicarrier signal.

A carrier leak compensating means 2 adds carrier leak compensation values CLCancelI and CLCancelQ which are opposite in phase to carrier leaks to the output of the digital modulating means 1 according to the following equations:

Formulae 1:

$$TxI'(t) = TxI(t) + CLCancelI$$

$$TxQ'(t) = TxQ(t) + CLCancelQ \quad \text{<Formulae 1>}$$

where

TxI(t): I-phase signal of the output of the digital modulating means;

TxQ(t): Q-phase signal of the output of the digital modulating means;

TxI'(t): I-phase signal of the output of the carrier leak compensating means;

TxQ'(t): Q-phase signal of the output of the carrier leak compensating means;

CLCancelI: I-phase carrier leak compensation value; and

CLCancelQ: Q-phase carrier leak compensation value.

A D/A converter 3 converts the transmission digital signal (I component and Q component) received from the carrier leak compensating means 2 into an analog signal.

An analog quadrature modulator 4 converts the complex signal received from the D/A converter 3 into a real signal, up-converts it to a desired RF (radio frequency) band, and outputs a resulting signal. The transmitter with carrier leak compensation transmits this RF signal.

A frequency converting means 5 down-converts a signal that is based on the output of the analog quadrature modulator 4 to a second IF.

An A/D converter 6 samples and quantizes an output signal of the frequency converting means 5 and outputs a resulting digital signal.

A digital quadrature detecting means 7 performs digital quadrature detection on the real signal received from the A/D converter 6 so that the frequency of each carrier coincides with the first IF carrier frequency which is set in the digital quadrature modulating means, and outputs a resulting complex signal.

A carrier leak detecting means 8 detects carrier leak components from the output signal of the digital quadrature detecting means 7 by, for example, a method using the following equations:

<Formulae 2>

$$CLDetI = \frac{\Sigma AcprxI(t)}{N} \qquad \text{Formulae 2}$$

$$CLDetQ = \frac{\Sigma AcprxQ(t)}{N}$$

where

AcprxI(t): I-phase signal of the output of the digital quadrature detecting means;

AcprxQ(t): Q-phase signal of the output of the digital quadrature detecting means;

CLdetI: I-phase carrier leak detection value;

CLdetQ: Q-phase carrier leak detection value; and

N: Number of cumulative addition samples.

A carrier leak compensation value control means 9 determines carrier leak compensation values to be set newly in the carrier leak compensating means 2 from the carrier leak detection values detected by the carrier leak detecting means 8, and sets them in the carrier leak compensating means 2. More specifically, the carrier leak compensation value control means 9 multiplies each carrier leak detection value CLDet by a proper positive coefficient that is smaller than "1" and subtracts a resulting value from the carrier leak compensation value CLCancel.

The frequency converting means 5, the A/D converter 6, and the digital quadrature detecting means 7 are together called a feedback means. The first IF center frequency is arbitrary and may be equal to the baseband frequency or 0 Hz.

FIG. 2 shows the internal configuration of the digital modulating means 1.

Bandwidth limitation filters 111-114 perform bandwidth limitation on input baseband signals which are complex signals (also called an analytical signals) each consisting of an I-phase (in-phase) component and a Q-phase (quadrature-phase) component so that their frequency ranges fall within a bandwidth assigned to one carrier.

Up-sampling means 121-124 up-sample bandwidth-limited, chip-rate transmission signals to a desired sampling frequency. The bandwidth limitation filters 111-114 and the up-sampling means 121-124 may be combined stepwise as appropriate.

Digital quadrature modulating means 131-134 perform digital quadrature modulation (complex frequency modulation) by complex-multiplying the up-sampled transmission signals by local signals corresponding to respective carrier frequencies.

A multicarrier adder 140 outputs, as an output of the digital modulating means 1, a multicarrier signal obtained by additively combining carrier signals produced through the digital quadrature modulation. The multicarrier signal is also a complex signal.

Another technique relating to the invention which is different from the above-described techniques is known in which a linear distortion is estimated from behavior of the output level of an analog quadrature modulator receiving a test signal and a linear distortion including a DC offset is compensated for by using affine transformation (refer to Non-patent document 1, for example).

Patent document 1: JP-A-2004-221653
Patent document 2: JP-A-2002-208979
Patent document 3: JP-A-2002-164947
Patent document 4: JP-A-2002-7285
Patent document 5: JP-A-2001-339452
Patent document 6: JP-A-11-88454
Patent document 7: JP-A-11-27331
Patent document 8: JP-A-10-136048

Non-patent document 1: Hiroshi Suzuki and other one person, "Affine Transformation Linear Distortion Compensation—Application to Linear Signal Transmission Including Equalization in Mobile Wireless Communications—," The Transactions of the Institute of Electronics, Information and Communication Engineers (IEICE) B-II, IEICE, January 1992, Vol. J75-B-II, No. 1, pp. 1-9.

SUMMARY OF THE INVENTION

However, conventional transmitters have a problem that they cannot detect a carrier leak with sufficient accuracy depending on a carrier arrangement being used.

For example, where digital quadrature modulation is performed on a W-CDMA base band signal having a bandwidth of 3.84 MHz by the digital modulating means at a carrier frequency in a frequency range of −1.92 MHz to +1.92 MHz (e.g., by a zero IF method), a carrier leak occurs within a modulation wave band. In this case, it has been confirmed by a computer simulation that carrier leak components cannot be detected correctly even if feedback signals are added cumulatively.

FIG. 7 is a graph (simulation result) showing how the carrier leak compensation value varies as its update proceeds in the case where the conventional carrier leak detecting means is used. The simulation was performed in such a manner that a single carrier transmission was assumed and a fixed carrier leak component (DC value "−60") was given on the I-phase side. It is seen that whereas the compensation value converges to +60 in the case of a +5 MHz setting in which the carrier leak is located outside the modulation wave band, the compensation value oscillates and compensation is not performed correctly in the case of a 0 MHz setting in which the carrier leak exists within the modulation wave band.

Conventionally, a carrier leak is detected based on the assumption that because of the randomness of a W-CDMA signal the average value (=(cumulative addition value)/(number of cumulative addition samples)) of a signal component becomes zero if the signal component is added cumulatively over a sufficiently long time interval; that is, a carrier leak is detected by utilizing the notion that only a carrier leak component having a fixed phase is extracted. However, if there exists a carrier whose carrier frequency (including its image) is set in a range of −1.92 MHz to +1.92 MHz, since a transmission signal itself has a DC component, the DC component tends to remain as an error component in a cumulative addition value and its average value is not apt to become zero even if the number of cumulative addition samples is increased.

FIG. 9 shows a result of a computer simulation in which two patterns of carrier frequencies +5 MHz and 0 MHz were set for a W-CDMA single carrier signal and a relationship between the signal component average value and the number of cumulative addition samples in an output signal of the digital quadrature modulating means without a carrier leak component was simulated. FIG. 9 shows that whereas the average value converges to zero when the number of cumulative addition samples is greater than or equal to 10,000 in the case where the carrier frequency is +5 MHz, the average value deviates to the minus side and does not converge even if the number of cumulative addition samples is increased in the case where the carrier frequency is 0 MHz. The carrier leak compensation value thus oscillates as shown in FIG. 7.

The present invention has been made against the above-described background, and an object of the present invention is therefore to provide a transmitter and a carrier leak detection method capable of detecting a carrier leak at high speed with high accuracy for every carrier frequency setting.

Next, the I/Q gain imbalance will be described.

When analog quadrature modulation is performed, a transmission is not made with identical I and Q average levels even if I and Q digital signals have the same average amplitude because they are processed by different D/A converters. When the I and Q gains are not balanced, a distortion due to I/Q gain imbalance occurs in an output signal of the analog quadrature modulator at a frequency (2L−C) where C is a carrier frequency and L is a local signal frequency.

For example, in an example configuration of a conventional transmitter, neither a level adjustment section 308 nor a phase adjustment section 309 shown in FIG. 12 is provided and a transmission signal is not input to an I/Q gain ratio detection section 310 from a digital modulating means 301 though a feedback signal is input to it from a digital quadrature detecting means 307. The conventional I/Q gain ratio detection section calculates an I/Q gain ratio from the feedback signal.

In such a conventional technique which detects an I/Q gain ratio only from feedback signal data, in the case where, for example, the carrier frequency is set the same as a transmission center frequency, the average amplitude ratio does not become equal to 1 and comes to include a large error even if it is calculated from an output transmission signal of a digital modulation section without an I/Q gain imbalance. This raises a problem that a distortion of an I/Q gain imbalance cannot be compensated for correctly.

Next, the deviation in orthogonality will be described.

In wireless transmitters using an analog quadrature modulator, it is difficult for the analog quadrature modulator to output a correct quadrature modulated wave. One reason is as follows. It is difficult to correctly produce a π/2 phase shifter which is part of the analog quadrature modulator. As a result, a deviation in orthogonality occurs in digital I and Q signals that are input to the analog quadrature modulator and the orthogonality deviation is superimposed, as a distortion, on a transmission signal that is output from the analog quadrature modulator.

In this problem, the related characteristics vary due to a temperature variation or a variation with age.

A method for solving this problem is described in Japanese Patent Application No. 2005-198591.

In a transmitter according to this conventional technique, for example, an orthogonality deviation detecting means detects an orthogonality deviation only from feedback signals I'(t) and Q'(t) and an orthogonality deviation control means updates an orthogonality deviation correction parameter on the basis of the deviation detected by the orthogonality deviation detecting means and sets resulting correction parameters in an orthogonality deviation corrector.

More specifically, $\sin \phi_{RX}$ is calculated according to an equation that is similar to the second equation of <Formulae 16>, an orthogonality deviation correction parameter $\sin \psi'$ is updated according to $\sin \psi' = \sin \psi + \mu \sin \phi_{RX}$, and values calculated according to equations that are similar to <Formulae 19> are set in the orthogonality deviation corrector, where $\sin \psi'$ is a current value, $\sin \psi$ is a preceding value, and $\mu$ is a coefficient ($0 < \mu \leq 1$).

However, it has been found that the conventional orthogonality deviation detection method likewise cannot detect an orthogonality deviation correctly in the case where a carrier frequency is set in the above-described manner.

A description will be made of the principle of occurrence of a distortion due to an orthogonality deviation, an example frequency setting pattern with which correct detection is possible, and an example frequency setting pattern with which correct detection is impossible.

FIGS. 20(a) and 20(b) outline relationships between a transmission signal carrier frequency and a band where a distortion occurs due to an orthogonality deviation. If the orthogonality between the I phase and the Q phase is not maintained correctly, an orthogonality deviation appears as a distortion 702a or 702b at a position that is symmetrical with the position of a carrier 701a or 701b with respect to the center frequency fc.

For example, as shown in FIG. 20(a), if the carrier 701a is set adjacent to the center frequency fc, the distortion 702a occurs on the opposite side of the center frequency fc (axis of symmetry) to the carrier 701a.

For example, as shown in FIG. 20(b), if the carrier 701b is set at the center frequency fc, the distortion 702b also occurs at the center frequency fc and coexists with the carrier 701b.

Assume that in a transmission IF signal that has been subjected to digital quadrature modulation f1a and f2a are arbitrary frequencies in a carrier band (f1a≠f2a). If no combination of f1a and f2a exists that satisfies f1a+f2a=0 (the case of FIG. 20(a)), an orthogonality deviation can be detected correctly.

In contrast, if a combination of f1b and f2b exists that satisfies f1b+f2b=0 (the case of FIG. 20(b)), an orthogonality deviation cannot be detected correctly by the conventional orthogonality deviation detection method.

Attention will now be given to a transmission digital signal that is output from the digital modulating means.

Since no orthogonality deviation exists between transmission digital signals TxI(t) and TxQ(t), $\sin \phi_{TX}$ that is calculated from these signals according to the orthogonality detection equation which is the first equation of <Formulae 16> should always be equal to zero. Should $\sin \phi_{TX}$ not be equal to zero, $\sin \phi_{RX}$ that is calculated from a feedback signal includes a similar error component and hence cannot be detected correctly.

In view of the above, what values $\sin \phi_{TX}$ takes with the frequency setting patterns as shown in FIGS. 20(a) and 20(b) was checked by calculating $\sin \phi_{TX}$ from a transmission digital signal by a simulation.

FIG. 21 shows a result of the simulation, that is, relationships between the orthogonality deviation detection value (distortion value) $\phi_{TX}(°)$ calculated from a transmission digital signal and the number of cumulative addition samples. This is a result of a simulation in which the transmission signal was a W-CDMA signal (single carrier), the carrier frequency was +5.0 MHz (case (a)) or 0 MHz (case (b)), the sampling frequency was 92.16 MHz, and the signal maximum amplitude was 16 bits. FIG. 21 shows how the orthogonality deviation detection value $\phi_{TX}$ of IF band digital transmission signals TxI(t) and TxQ(t) varies as the number of cumulative addition samples is varied.

The frequency +5.0 MHz (case (a)) corresponds to FIG. 20(a) and 0 MHz (case (b)) corresponds to FIG. 20(b).

If attention is paid to the relationships between the orthogonality deviation detection value and the number of cumulative addition samples of cases (a) and (b) shown in FIG. 21, one can recognize that the orthogonality deviation detection value includes an error component if the number of cumulative addition samples is small. Therefore, it is necessary to set the number of cumulative addition samples to such a value that no error component is included according to a wireless communications system.

In the result of case (a), $\phi_{TX}$ converges to zero as the number of cumulative addition samples increases.

In contrast, in the result of case (b), the orthogonality deviation detection value $\phi_{TX}$ decreases but does not reach zero as the number of cumulative addition samples increases. A detection error of $\phi_{TX}$ is also included in a detection value of a feedback signal, which means that an orthogonality deviation cannot be detected correctly.

FIG. 22 shows example relationships between the correction parameter ψ' (degrees) and the number of times of update in a conventional wireless communications apparatus.

This example shows how the correction parameter ψ' varies in the case where the transmission signal is a W-CDMA signal (single carrier) and the carrier frequency is 0 MHz (corresponds to FIG. 20(*a*)) or 5.0 MHz (corresponds to FIG. 20(*b*)).

The number of cumulative addition samples per update was set at 16,384, the coefficient μ was set at ¼, and the orthogonality deviation occurring in the analog quadrature modulator was set at 0.5°.

In the case where the transmission signal is 5 MHz, it is seen that the correction parameter ψ' converges to 0.5° as the number of times of update increases, that is, an orthogonality deviation can be detected correctly by the orthogonality deviation detecting means.

However, where the carrier frequency of a transmission signal is 0 MHz, the correction parameter ψ' does not converge and continues to vary as the number of times of update increases. It is thus understood that an orthogonality deviation cannot be detected correctly.

As described above, in the prior art, where the IF band of a digital transmission signal includes 0 MHz, a detection error of the transmission signal is included in a feedback signal and an orthogonality deviation cannot be detected and corrected accurately.

As described above, conventional transmitters have the problem that they cannot detect a distortion due to a carrier leak, an I/Q gain imbalance, or an orthogonality deviation with sufficient accuracy depending on a carrier arrangement being used.

In view of the above, an object of the invention is therefore to provide a transmitter etc. capable of effectively detecting and correcting a distortion due to a carrier leak, an I/Q gain imbalance, or an orthogonality deviation for every carrier frequency setting.

A transmitter which transmits a multicarrier signal obtained by combining one or plural modulated carriers (one of their carrier bands is set so as to include 0 Hz), comprising:

carrier leak compensating means for adding carrier leak compensation values corresponding to an I phase and a Q phase, respectively, to a received multicarrier signal and outputting a resulting signal;

an analog quadrature modulator for up-converting the output signal of the carrier leak compensating means to a radio frequency;

feedback means for receiving and quadrature-detecting part of an output signal of the analog quadrature modulator and outputting a feedback signal in which carrier frequencies are substantially the same as those having said arrangement;

carrier leak detecting means for detecting an I-phase carrier leak and a Q-phase carrier leak on the basis of a difference between cumulative addition values, calculated in periods corresponding to each other, of an amplitude/phase-adjusted feedback signal and the multicarrier signal; and carrier leak compensation value control means for determining carrier leak compensation values to be set newly in the carrier leak compensating means on the basis of the detected carrier leaks.

A transmitter comprising:

digital modulating means for combining one or plural input digital baseband signals after subjecting them to bandwidth limitation, up-sampling, and digital quadrature modulation to corresponding carrier frequencies and outputting a resulting multicarrier signal in a first intermediate frequency band;

carrier leak compensating means for adding carrier leak compensation values corresponding to an I phase and a Q phase, respectively, to the multicarrier signal and outputting a resulting signal;

a D/A converter for converting an output of the carrier leak compensating means into an analog signal;

an analog quadrature modulator for converting the output signal of the D/A converter into a real signal and up-converting it to a radio frequency;

frequency converting means for receiving part of an output of the analog quadrature modulator and down-converting it to a second intermediate frequency band;

an A/D converter for converting an output of the frequency converting means into a digital signal;

digital quadrature detecting means for quadrature-detecting the output signal of the A/D converter so that the carrier frequencies become equal to those set in the first intermediate frequency band by the digital modulating means, and generating a feedback signal having an I-phase component and a Q-phase component;

transmission signal cumulative adding means for cumulatively adding a prescribed number of samples of the multicarrier signal for each of the I-phase component and the Q-phase component;

feedback signal cumulative adding means for cumulatively adding samples, corresponding in number to the cumulative addition samples of the multicarrier signal, of the feedback signal for each of the I-phase component and the Q-phase component;

carrier leak detecting means for determining an amplitude ratio by calculating a square root of a ratio of average power values of the multicarrier signal and the feedback signal, determining a phase difference by calculating a complex correlation coefficient between the multicarrier signal and the feedback signal, determining differences between cumulative addition values, calculated by the feedback means, of the feedback signal and those of the multicarrier signal after equalizing an amplitude and a phase of the former to those of the latter on the basis of the amplitude ratio and the phase difference, and detecting carrier leak components on the basis of the differences, by running a program; and carrier leak compensation value control means for updating the carrier leak compensation values by adding carrier leak detection values multiplied by a positive number that is smaller than or equal to 1 to carrier leak compensation values currently set in the carrier leak compensating means.

A carrier leak detecting method comprising the steps of:

calculating a cumulative addition value of signal samples obtained through sampling and quadrature detection for each of an I phase and a Q phase in a predetermined sampling interval at a rate that is higher than or equal to a chip rate and lower than or equal to a sampling rate;

detecting am amplitude ratio to and a phase difference from a reference signal on the basis of samples that is smaller in number than samples that should be obtained in the sampling interval for the cumulative addition; and detecting carrier leak components on the basis of results obtained by adjusting an amplitude and a phase of the cumulative addition values using the amplitude ratio and the phase difference.

A transmitter which transmits a multicarrier signal obtained by combining one or plural modulated carriers, comprising:

I/Q gain ratio correcting means for performing operations that are based on I/Q gain ratio correction values of an I phase and a Q phase on a received multicarrier signal and outputting a resulting signal;

a D/A converter for converting the output of the I/Q gain ratio correcting means into an analog signal;

an analog quadrature modulator for up-converting the output signal of the D/A converter to a radio frequency;

feedback means for receiving and quadrature-detecting part of an output signal of the analog quadrature modulator and outputting a feedback signal in which carrier frequencies are substantially the same as those having said arrangement;

I/Q gain ratio detecting means for detecting an I/Q gain ratio on the basis of a ratio between I/Q gain ratios, calculated in periods corresponding to each other, of an amplitude/phase-adjusted feedback signal and the multicarrier signal; and I/Q gain ratio correction value control means for determining I/Q gain ratio correction values to be set newly in the I/Q gain ratio correcting means on the basis of the detected I/Q gain ratio.

A transmitter which transmits a multicarrier signal obtained by combining one or plural modulated carriers, comprising:

orthogonality deviation correcting means for performing operations that are based on orthogonality deviation correction values of an I phase and a Q phase on a received multicarrier signal and outputting a resulting signal;

an analog quadrature modulator for up-converting the output signal of the orthogonality deviation correcting means to a radio frequency;

feedback means for receiving and quadrature-detecting part of an output signal of the analog quadrature modulator and outputting a feedback signal in which carrier frequencies are substantially the same as those having said arrangement;

orthogonality deviation detecting means for detecting an orthogonality deviation on the basis of a difference between orthogonality deviations, calculated in periods corresponding to each other, of the feedback signal and the multicarrier signal; and orthogonality deviation correction value control means for determining orthogonality deviation correction values to be set newly in the orthogonality deviation correcting means on the basis of the detected orthogonality deviation.

BRIEF DESCRIPTION OF THE DRAWINGS

FIG. 9 shows a result of a computer simulation of a relationship between the signal component average value and the number of cumulative addition samples;

FIG. 10 shows example relationships between the processing time taken to update the carrier leak compensation values and the number of cumulative addition samples;

DETAILED DESCRIPTION OF THE INVENTION

The present invention will be hereinafter described by way of embodiments with reference to the drawings. However, it is not always the case that all components described in each embodiment should be used in combination in the invention. Furthermore, arbitrary combinations of the features of the embodiments and the cited references may also be included in the invention.

Embodiment 1

Figure 1:
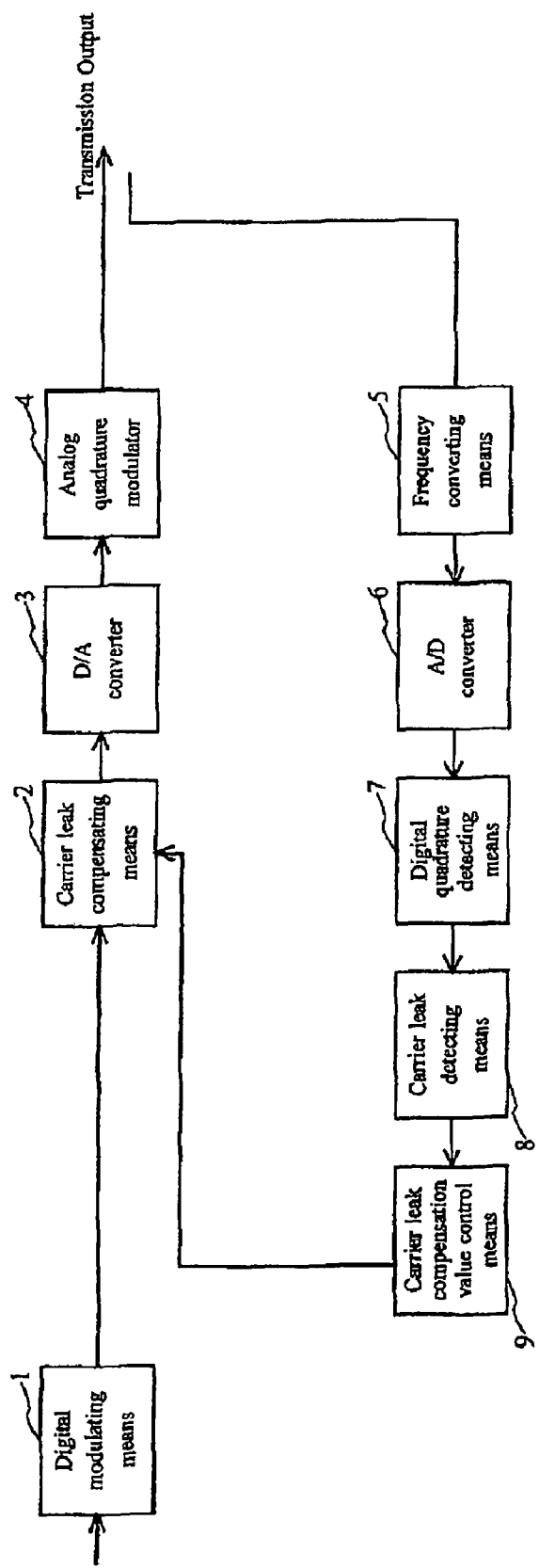
FIG. 1 shows the configuration of a conventional transmitter with carrier leak compensation.
Figure 2:
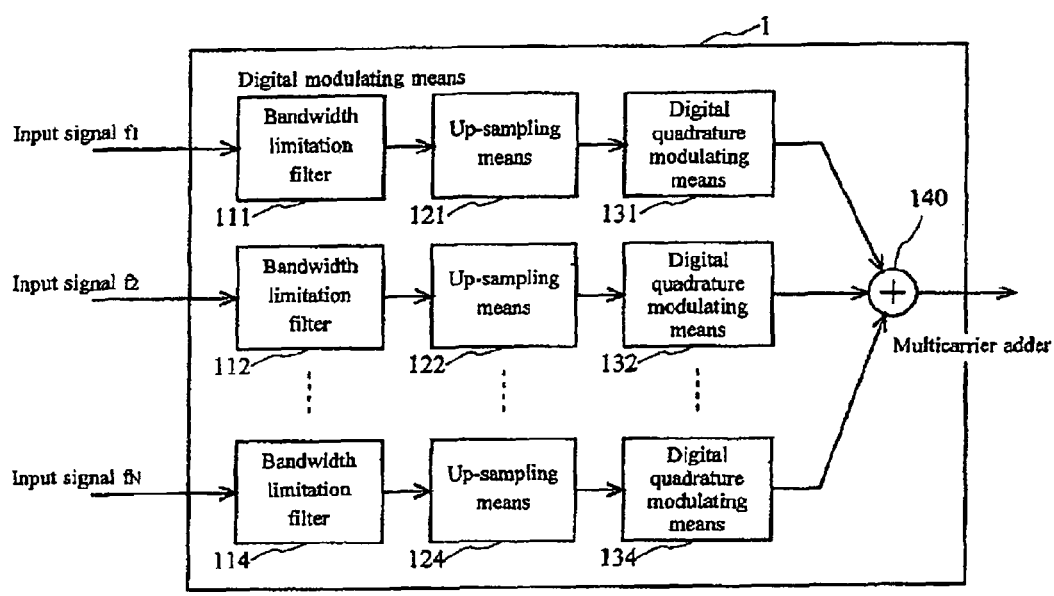
FIG. 2 shows the internal configuration of a digital modulating means 1.
Figure 3:
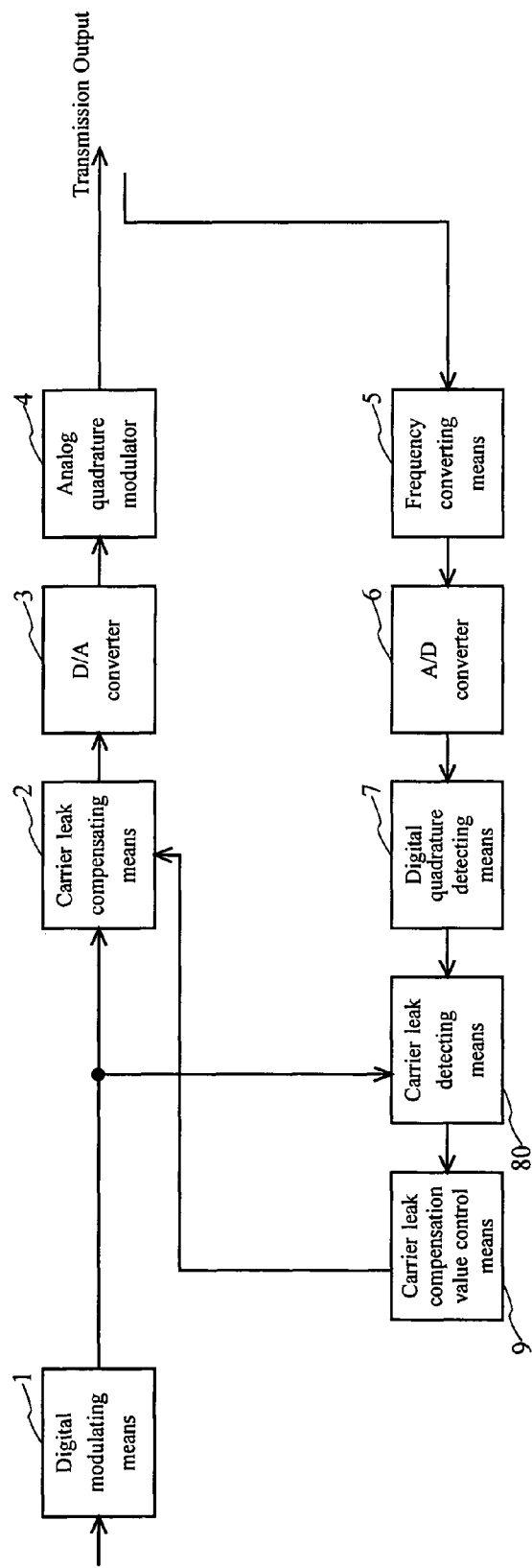
FIG. 3 shows the configuration of a radio transmitter according to a first embodiment.

FIG. 3 shows the configuration of a transmitter according to this embodiment. Components having the same components in the conventional transmitter will be given the same reference symbols as the latter and will not be described in detail.

First, a carrier leak detecting means 80 receives an output signal (hereinafter referred to as "feedback signal") of the digital quadrature detecting means 7 and an output signal (hereinafter referred to as "transmission signal") of the digital modulating means 1 and writes them in a memory at the same time. These output signals may be either signals to be transmitted from the transmitter for an actual communication or dedicated test signals. At the time of writing, the sampling rates of the transmission signal and the feedback signal are the same.

However, a signal processing delay exists between the transmission signal and the feedback signal. The delay is determined in advance by, for example, transmitting an impulse signal and signal data are written to the memory with a shift that is equal to the thus-determined delay. As a result, signal data of the transmission signal and the feedback signal are written to the memory with the same timing, that is, signal data in completely the same period are written to the memory. The details of a memory control may be equivalent to those described in Japanese Patent Application No. 2005-198591.

Then, the carrier leak detecting means 80 reads the signals written in the memory and performs processing of equalizing the amplitude (gain) and the phase of the feedback signal to those of the transmission signal. First, as for the amplitude adjustment, an amplitude ratio AmplitudeRatio is calculated by calculating average power values of the transmission signal and the feedback signal, taking their ratio, and calculating its square root according to <Formula 3>.

< Formula 3 >

$$AmplitudeRatio = \sqrt{\frac{\sum (TxI(t)^2 + TxQ(t)^2)}{\sum (AcprxI(t)^2 + AcprxQ(t)^2)}}$$  Formula 3 where

TxI(t): transmission signal (I phase);

TxQ(t): transmission signal (Q phase);

AcprxI(t): feedback signal (I phase) before amplitude and phase adjustments;

AcprxQ(t): feedback signal (Q phase) before the amplitude and phase adjustments;

AcprxI'(t): feedback signal (I phase) after the amplitude and phase adjustments; and AcprxQ'(t): feedback signal (Q phase) after the amplitude and phase adjustments.

Next, as for the phase adjustment, complex correlation operations are performed on the transmission signal and the feedback signal according to <Formulae 4> and a phase difference (the transmission signal is used as a reference) is calculated in the form of cos θ and sin θ from correlation values according to <Formulae 5>.

Formulae 4:

$$CorrelateI = \Sigma(TxI(t) \times AcprxI(t) + TxQ(t) \times AcprxQ(t))$$

$$CorrelateQ = \Sigma(TxQ(t) \times AcprxI(t) - TxI(t) \times AcprxQ(t))$$  <Formulae 4>

< Formulae 5 >

$$\cos\theta = \frac{CorrelateI}{\sqrt{CorrelateI^2 + CorrelateQ^2}}$$  Formulae 5

$$\sin\theta = \frac{CorrelateQ}{\sqrt{CorrelateI^2 + CorrelateQ^2}}$$

Then, the phase of the feedback signal is rotated by θ on a sample-by-sample basis and a result is multiplied by the amplitude ratio according to <Formulae 6>. The phase is thus adjusted by equalizing the average amplitude and phase of the feedback signal to those of the transmission signal.

< Formulae 6 >

$$AcprxI'(t) = AmplitudeRatio \times \{AcprxI(t) \times \cos\theta - AcprxQ(t) \times \sin\theta\}$$

$$AcprxQ'(t) = AmplitudeRatio \times \{AcprxQ(t) \times \cos\theta + AcprxI(t) \times \sin\theta\}$$  Formulae 6

Then, the carrier leak detecting means 80 detects carrier leak components CLDetI and CLDetQ by performing detection processing of <Formulae 7> on the transmission signal and the amplitude/phase-corrected feedback signal.

< Formulae 7 >

$$CLDetI = \frac{\Sigma AcprxI'(t) - \Sigma TxI(t)}{N}$$  Formulae 7

$$CLDetQ = \frac{\Sigma AcprxQ'(t) - \Sigma TxQ(t)}{N}$$

where N is the number of cumulative addition samples.

A description will now be made of the reason why the carrier leak detecting means 80 subtracts the cumulative addition value of the transmission signal from that of the feedback signal. As described above, if a carrier leak exists in a carrier band, the average of a signal component does not become zero and remains as an error component even if it is subjected to cumulative addition. However, since the error components included the cumulative addition values of the transmission signal and the feedback signal are the same in magnitude, the error component can be eliminated by subtracting the cumulative addition value of the transmission signal from that of the feedback signal, whereby only a carrier leak component can be extracted.

The carrier leak compensation value control means 9 updates carrier leak compensation values CLCancel that are currently set by taking into account the carrier leak detection values CLDet detected by the carrier leak detecting means 80, and newly sets updated values in the carrier leak compensating means.

Example processing for updating the carrier leak compensation values will be described below. The carrier leak components CLDet detected by the carrier leak detecting means 80 are carrier leak components that remain uncompensated for with respect to the carrier leak correction values that are currently set in the carrier leak compensating means 2. No problems arise if a carrier leak is detected ideally, that is, without any errors. However, in reality, it is impossible to perform a detection with no errors because of influences of noise and the number of bits of the A/D converter. In view of this, according to Formulae 8, the carrier leak detection values are added to the compensation values after multiplying the former by a coefficient that is smaller than 1, whereby error components remaining in the carrier leak detection values are canceled out and the carrier leak is compensated for in plural steps. However, if the update coefficient is too small, convergence to carrier leak compensation values takes long time. Therefore, the update coefficient should be set at a maximum value within such a range that convergence is made without undue variations.

Formulae 8:

$$CLCancelI' = CLCancelI - \mu CLDetI$$

$$CLCancelQ' = CLCancelQ - \mu CLDetQ$$  <Formulae 8> where
CLCancelI: currently set carrier leak compensation value (I phase);
CLCancelQ: currently set carrier leak compensation value (Q phase);
CLCancel'I: carrier leak compensation value (I phase) to be set newly;
CLCancel'Q: carrier leak compensation value (Q phase) to be set newly; and
μ: update coefficient (a constant that satisfies $0<\mu\leq1$).

In the technique disclosed in Japanese Patent Application No. 2005-198591, decimation is made in the case where the sampling rate is set high to compensate for high-order distortions. In contrast, in this embodiment, consecutive samples are processed at the sampling rate. However, also in this embodiment, decimation may be made to, for example, equalize the sampling rate of a feedback signal to that of a transmission signal.

The embodiment makes it possible to detect a carrier leak stably with high accuracy even in the case where one of IF carrier bands to be handled by the D/A converter includes 0 Hz.

The feedback means may be shared by a receiver for receiving a signal from another station. In a TDD system, this is done by switching the input of the receiver to a transmission signal during a transmission period. This embodiment is particularly suitable to maintain carrier leak compensation in a multimode radio apparatus that handles a variety of RF frequencies.

Embodiment 2

Figure 4:
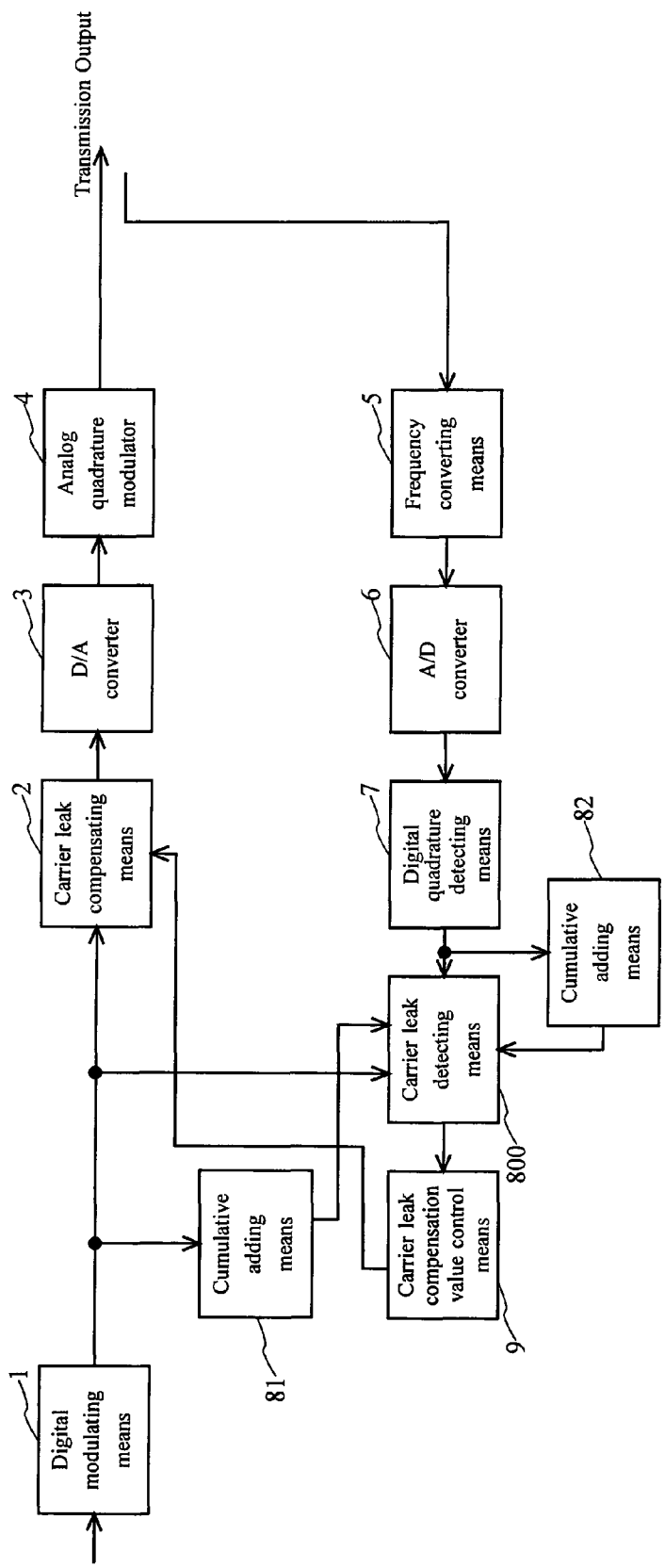
FIG. 4 shows the configuration of a control section according to a second embodiment.

FIG. 4 shows the configuration of a transmitter according to this embodiment. Components having the same components as in the conventional transmitter will be given the same reference symbols as the latter and will not be described in detail.

A transmission signal cumulative adding means 81 cumulatively adds a specified number of samples of a transmission signal of each of I and Q components at the sampling rate and passes a resulting cumulative addition value to a carrier leak detecting means 800.

A feedback signal cumulative adding means 82 cumulatively adds the specified number of samples of a feedback signal of each of I and Q components at the sampling rate and passes a resulting cumulative addition value to the carrier leak detecting means 800. Real-time processing at the sampling rate is enabled with addition of only small-scale hardware by employing, as the transmission signal cumulative adding means 81 and the feedback signal cumulative adding means 82, a device that performs computation by a hardware logic such as a PGA (programmable gate array) or another static or dynamic reconfigurable device.

A processing procedure of the carrier leak detecting means 800 will be described below. Like the carrier leak detecting means 80 of the first embodiment, the carrier leak detecting means 800 writes signal data of a transmission signal and a feedback signal to a memory after correcting a delay between them and detects an amplitude ratio and a phase difference between the transmission signal and the feedback signal. At this stage, it is not necessary to make amplitude and phase adjustments to the signal data written in the memory. Signal data to be written to the signal data memory may be part of signal data to be added cumulatively by the means 81 and 82 but should be included continuously in the interval of the signal data to be added cumulatively.

According to <Formulae 9>, the amplitude is adjusted by multiplying the cumulative addition value of the feedback signal by the detected amplitude ratio and the phase is adjusted by performing phase rotation on the basis of the detected phase difference. Each carrier leak component is detected by subtracting the cumulative addition value of the transmission signal from amplitude/phase-adjusted cumulative addition value of the feedback signal. The following calculation of carrier leak components and carrier leak compensation values will be performed in the same manner as in the first embodiment.

For example, the number of samples for the amplitude and phase detection may be smaller than the number of samples for the cumulative addition.

< Formulae 9 >

$$\Sigma AcprxI'(t) = \\ AmplitudeRatio \times \{\Sigma AcprxI(t) \times \cos\theta - \Sigma AcprxQ(t) \times \sin\theta\} \\ \Sigma AcprxQ'(t) = AmplitudeRatio \times \\ \{\Sigma AcprxQ(t) \times \cos\theta + AcprxI(t) \times \sin\theta\}$$

Formulae 9

The carrier leak detecting means 800 may be a program execution device such as a DSP (digital signal processor).

Although not shown in the figure, to perform the calculation of <Formula 3>, a transmission signal power cumulative adding means etc. may be added which cumulatively add a specified number of samples of power, that is, the sum of squares of an I component and a Q component, of each of the transmission signal and the feedback signal at the sampling rate using a hardware logic.

To confirm the effect of the embodiment, a computer simulation of carrier leak compensation was performed in which a DC component of a digital value "−60" was given to the I-phase-side D/A converter. A result will be described below.

Figure 5:
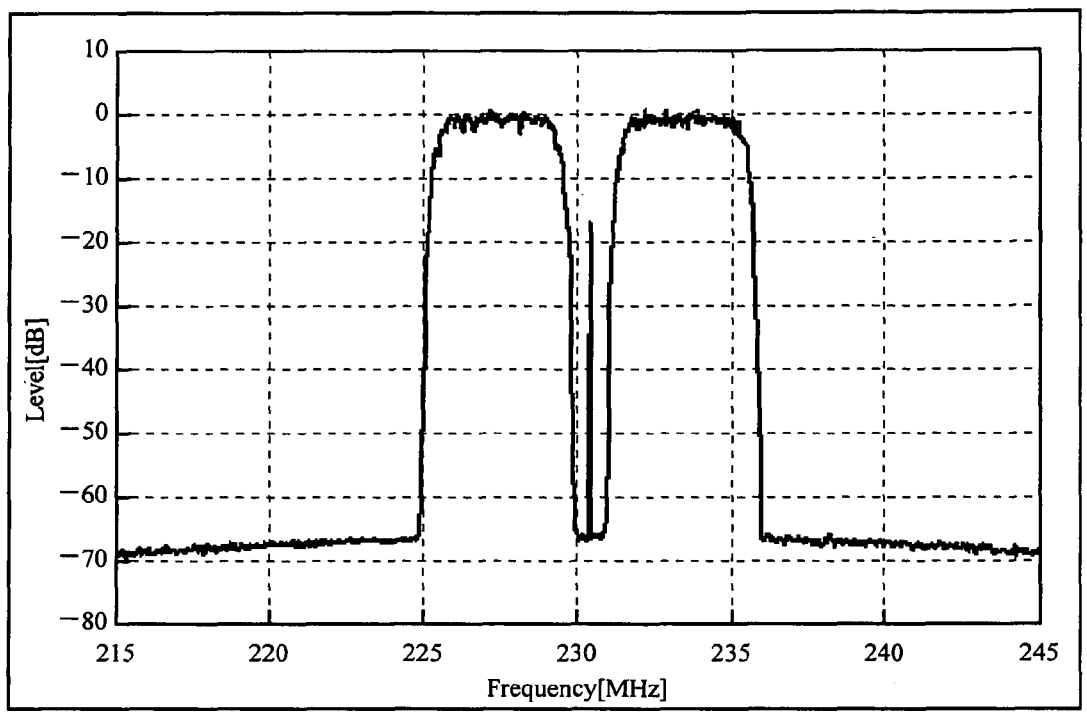
FIG. 5 shows a frequency spectrum of an output signal of an analog quadrature modulator at the time of a two-carrier transmission (before carrier leak compensation)

FIG. 5 shows a frequency spectrum of an output signal of the analog quadrature modulator at the time of a two-carrier transmission (before carrier leak compensation).

Figure 6:
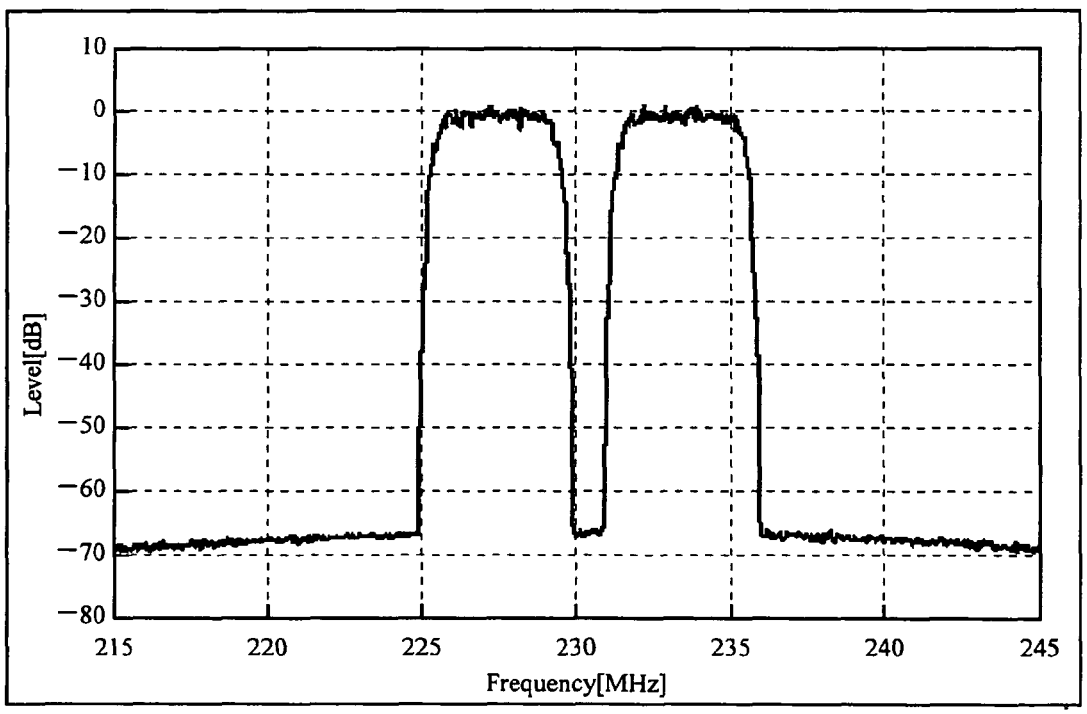
FIG. 6 shows a frequency spectrum of an output signal of an analog quadrature modulator in the second embodiment (after carrier leak compensation)

FIG. 6 shows a frequency spectrum of an output signal of the analog quadrature modulator in the embodiment (after carrier leak compensation). Carrier frequencies f1 and f2 of the digital modulating means 1 were set at −3 MHz and +3 MHz, respectively, and the frequency of a local signal that is input to the analog quadrature modulator was set at 230.4 MHz. It is seen from these figures that the transmitter according to the embodiment having the carrier leak detecting means 800 can transmit a distortionless signal in which a carrier leak has been compensated for correctly.

Figure 7:
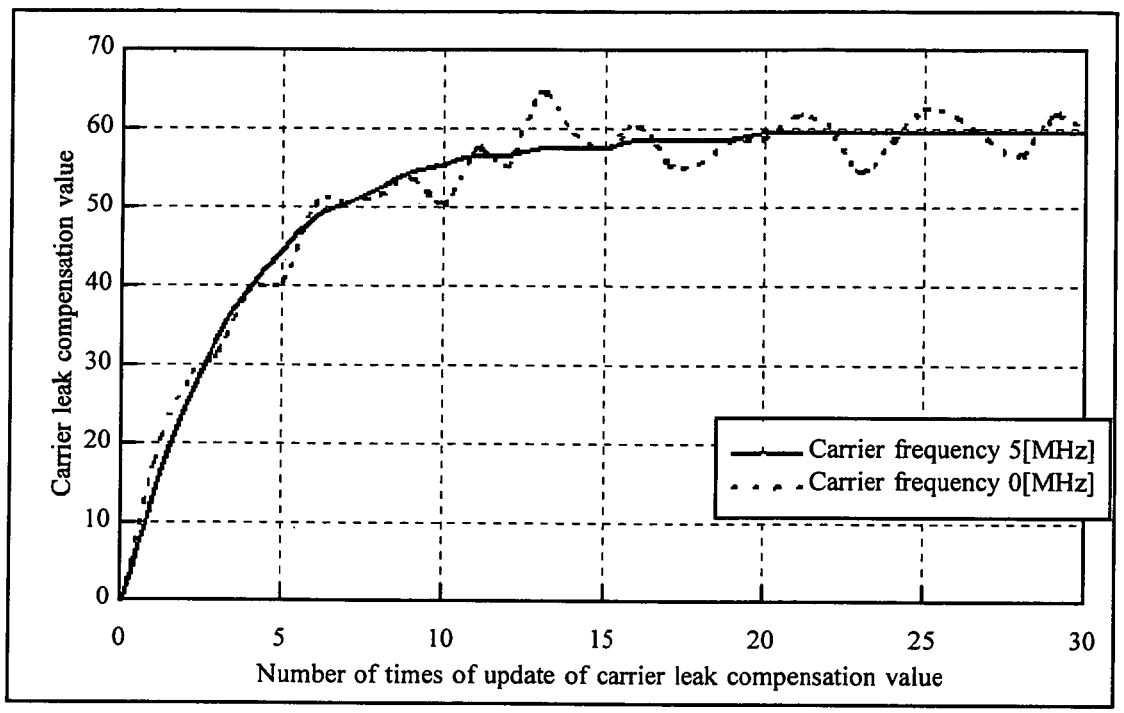
FIG. 7 is a graph (simulation result) showing how the carrier leak compensation value varies as its update proceeds in the case where a conventional carrier leak detecting means 8 is used.
Figure 8:
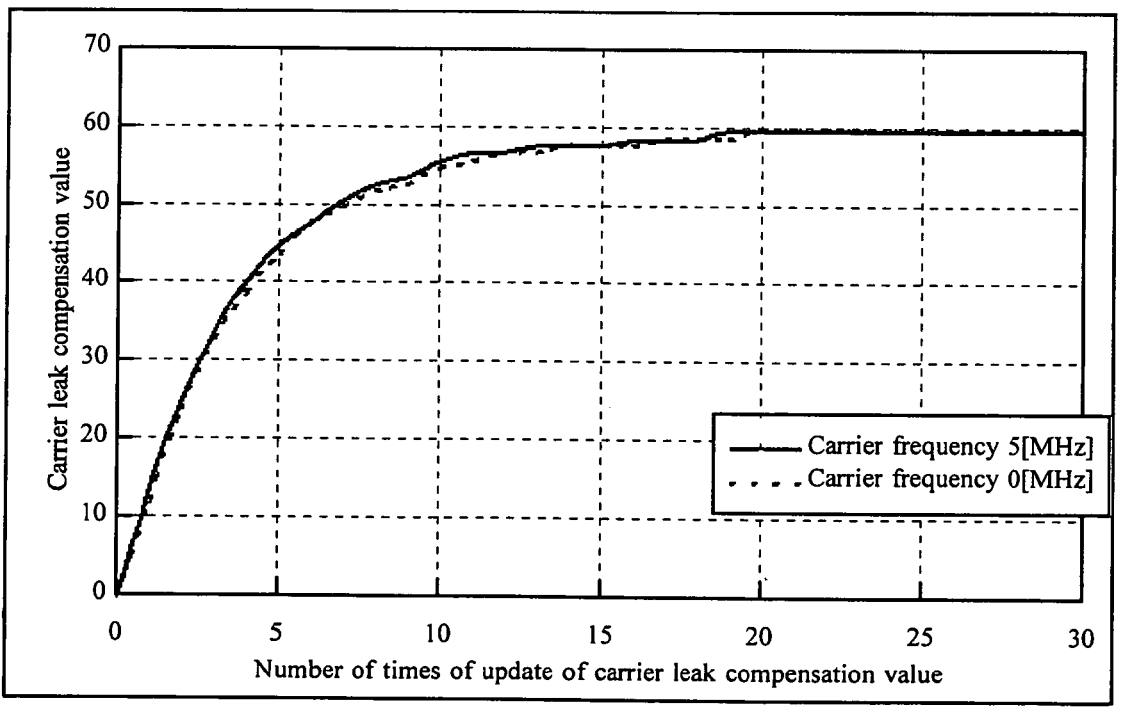
FIG. 8 is a graph (simulation result) showing how the carrier leak compensation value varies as its update proceeds in the case where a carrier leak detecting means 800 of the second embodiment is used.

FIG. 8 is a graph (simulation result) showing how the carrier leak compensation value varies as its update proceeds in the case where the carrier leak detecting means 800 of the embodiment is used. The simulation conditions were the same as in the case of FIG. 7. In either case, the update coefficient μ used for the carrier leak update was 0.25.

In the example, the carrier leak compensation value converges to "+60" in each of the cases of +5 MHz and 0 MHz. It is therefore understood that the carrier leak was compensated for correctly.

In the embodiment, the time taken by the carrier leak compensation values to converge can be reduced very much because the cumulative adding means for cumulatively adding signal data at the sampling rate are provided.

FIG. 10 shows example relationships between the processing time taken to update the carrier leak compensation values and the number of cumulative addition samples. This example assumes that the memory to which signal data are written by the carrier leak detecting means 800 has such a size that 1,024 samples of each of I data and Q data of each of a transmission signal and a feedback signal can be written to it, and that detection processing is performed by using data of 8,192 words. It is also assumed that 20 ms is taken to process 1,024 samples if a DSP performs the whole of one processing set from writing of signal data to the memory to detection and adjustment of an amplitude ratio and a phase difference.

Where no cumulative adding means are used, the same processing is repeated in a cycle of 1,024 samples and hence the processing time is given by (number of cumulative addition samples)/1,024×20 (ms).

Where the cumulative adding means are used, even if the number of cumulative addition samples is increased, the number of samples necessary for the detection of an amplitude ratio and a phase difference remains 1,024. Therefore, the processing time is calculated according to a formula 20 ms+(cumulative addition time of cumulative adding means (=(number of cumulative addition samples)/(sampling frequency 92.16 MHz)).

Taking the manner of convergence of FIG. 9 into account, assume that 8,192 samples, for example, are necessary for carrier leak detection. In the configuration without cumulative adding means, the carrier leak detecting means 80 needs to perform the processing set from writing to the memory to detection and adjustment of an amplitude ratio and a phase difference eight times to update the carrier leak compensation values once. In contrast, in the embodiment, it is sufficient to perform the processing set only once.

That is, the embodiment utilizes the characteristics that an amplitude ratio and a phase difference can be detected with sufficient accuracy if the number of samples is larger than about 1,024 and that the number N of cumulative addition samples governs the accuracy of the cumulative addition values used in <Formulae 7>. In an actual hardware implementation, the time taken by the writing to the memory and the cumulative addition which are performed by hardware only is very short and an increase in that time is almost negligible.

As such, the embodiment which employs the cumulative adding means makes it possible to set the number of cumulative addition samples to a number having a certain margin for the detection accuracy without causing almost no change in processing time. The embodiment can thus increase the ratio of the magnitude of a transmission signal to a residual carrier offset.

Each of the transmission signal cumulative adding means 81 and the feedback signal cumulative adding means 82 may perform cumulative addition using a weighted window function whose weight gradually decreases to zero near both ends of a cumulative addition interval.

Embodiment 3

Figure 11:
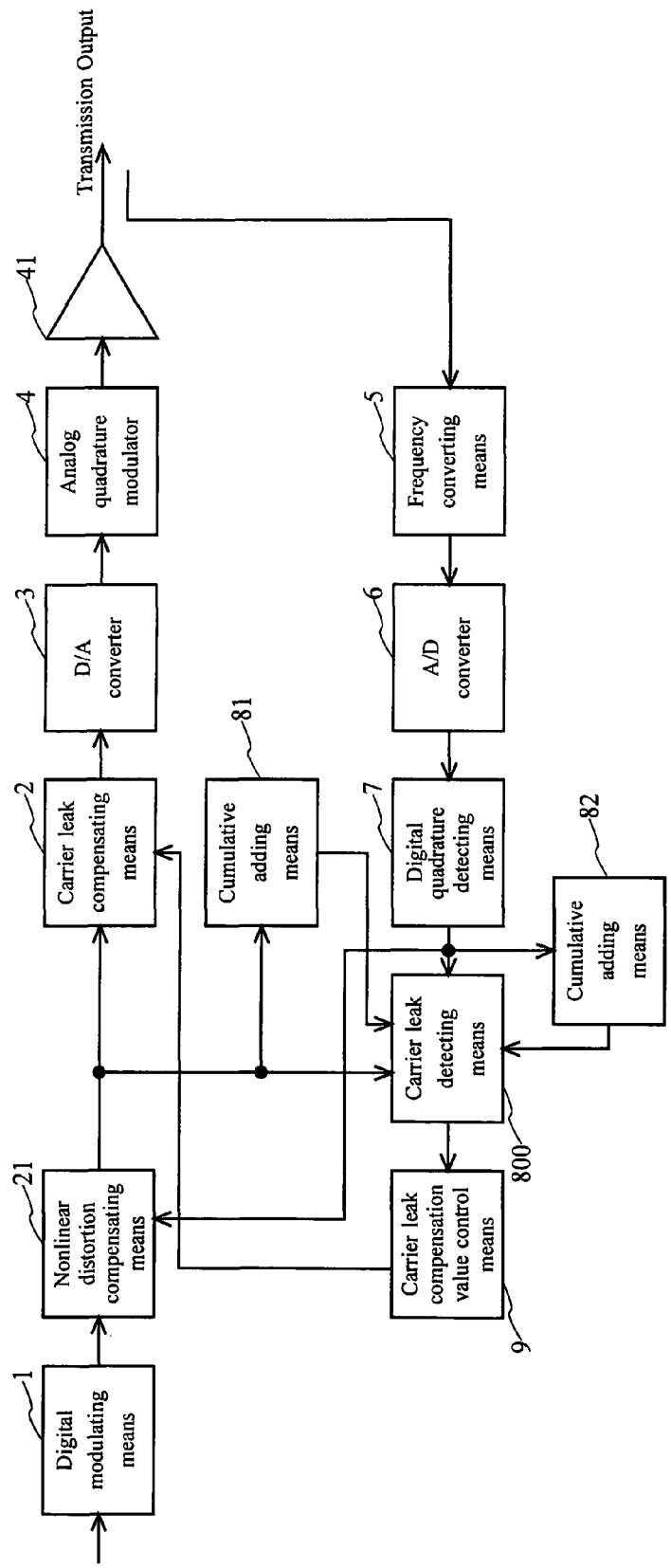
FIG. 11 shows the configuration of a transmitter according to a third embodiment.

FIG. 11 shows the configuration of a transmitter according to this embodiment. Components having the same components as in the above embodiments will be given the same reference symbols as the latter and will not be described in detail. The transmitter according to this embodiment is equipped with a nonlinear distortion compensating means 21 and a power amplifier 41 in addition to the components of the transmitter according to the second embodiment.

Disposed between the digital modulating means 1 and the carrier leak compensating means 2, the nonlinear distortion compensating means 21 has such an inverse characteristic as to cancel out a nonlinear distortion to occur in the power amplifier 41 and causes a pre-distortion in a transmission signal to be input to the carrier leak compensating means 2.

For example, the nonlinear distortion compensating means 21 complex-multiplies a multicarrier signal that is output from the digital modulating means 1 by a nonlinear distortion compensation value that corresponds to instantaneous power of the multicarrier signal. Furthermore, the nonlinear distortion compensating means 21 updates its own distortion characteristic adaptively by referring to a feedback signal so that it has a correctly inverse relationship to the characteristic of the power amplifier 41. Therefore, the nonlinear distortion compensating means 21 and the carrier leak detecting means 800 share the feedback signal.

The power amplifier 41 power-amplifies an RF transmission signal that is output from the analog quadrature modulator 4 and outputs a resulting transmitter output signal.

The nonlinear distortion compensating means 21 cannot update its own distortion characteristic properly unless it can detect a nonlinear distortion remaining in a feedback signal. In particular, a linear distortion such as a carrier leak may adversely affect the detection of a nonlinear distortion. In the embodiment, a nonlinear distortion can also be detected accurately because the carrier leak compensating means 2 reduces a carrier leak sufficiently.

Embodiment 4

Figure 12:
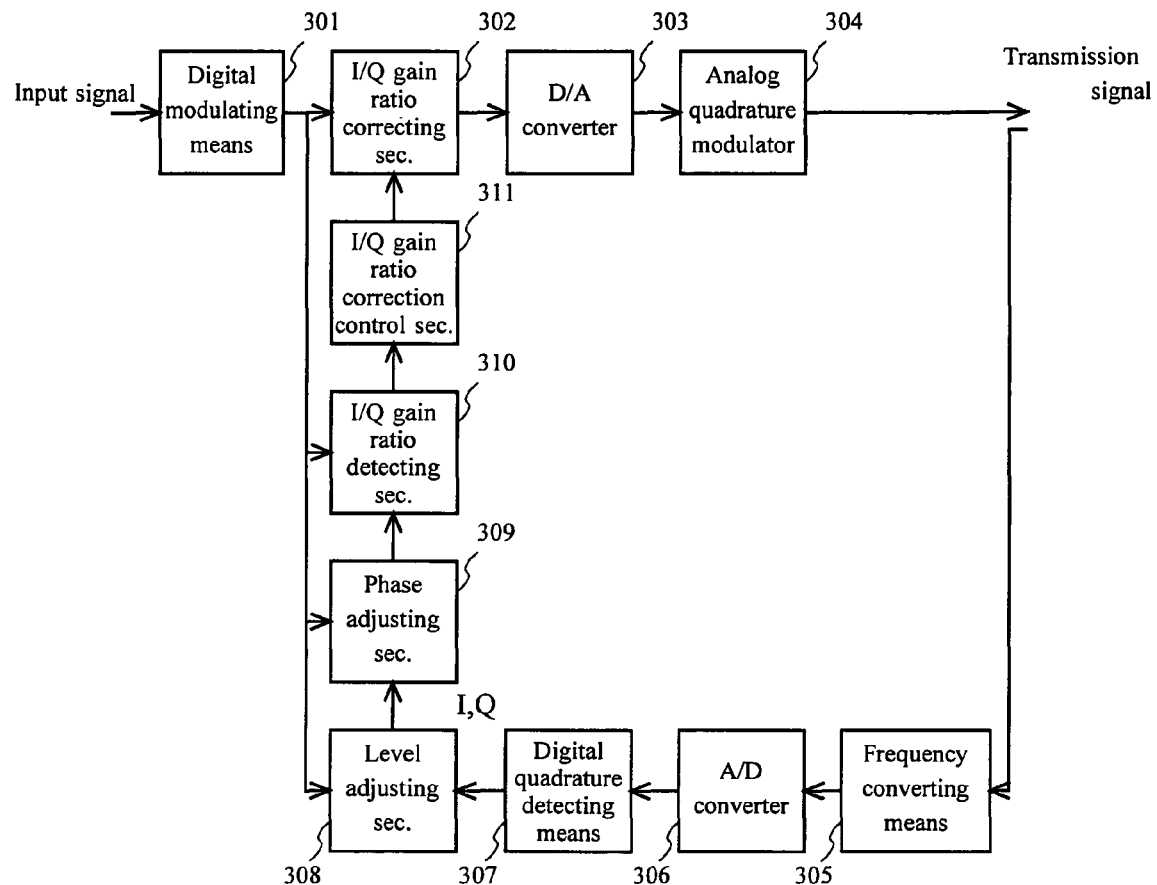
FIG. 12 shows the configuration of a transmitter according to a fourth embodiment.

FIG. 12 shows the configuration of a transmitter of a wireless communications apparatus according to this embodiment.

In this embodiment, a feedback means is composed of a frequency converting means 305, an A/D converter 306, and a digital quadrature detecting means 307. And an I/Q gain ratio detecting means whose functions include an amplitude/phase adjusting function is composed of a level adjusting section 308, a phase adjusting section 309, and an I/Q gain ratio detecting section 310.

Figure 13:
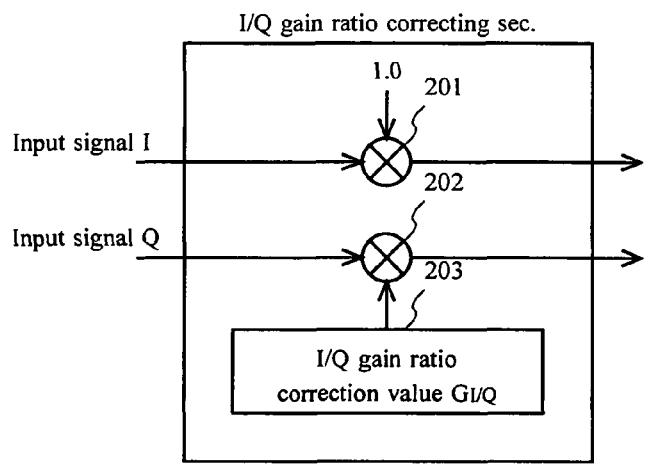
FIG. 13 shows an example configuration of an I/Q gain ratio correcting section.

A digital modulating means 301 performs bandwidth limitation and digital quadrature modulation to respective carrier frequencies on input baseband signals and also performs multicarrier composing. An output signal (transmission signal) of the digital modulating means 301 is input to an I/Q gain ratio correcting section (I/Q gain ratio correcting means) 302 and is stored in a memory as a transmission-side signal so as to be used for calculation in the I/Q gain ratio detecting section 310. The I/Q gain ratio correcting section 302 has a configuration shown in FIG. 13. A multiplier 201 multiplies an I-phase signal by 1.0 and a multiplier 202 multiples a Q-phase signal by an I/Q gain ratio correction value 203 calculated by an I/Q gain ratio correction control section (I/Q gain ratio correction control means) 311, whereby an I/Q gain imbalance is corrected.

A signal (digital signal) that is output from the I/Q gain ratio correcting section 302 is converted by a D/A converter 303 (e.g., separate converters for the I and Q components) into an analog signal, which is subjected to analog quadrature modulation and up-conversion to an RF band in an analog quadrature modulator 304. A resulting transmission signal is output from the analog quadrature modulator 304.

On the other hand, part of the transmission signal is down-converted to an IF band by the frequency converting means (down-converting section) 305 and then converted into a digital signal by the A/D converter 306. The digital signal (feedback signal) is converted into I-phase data and Q-phase data (i.e., I and Q signals are generated by quadrature detection) by the digital quadrature detecting means 307, the amplitude of the feedback signal is adjusted by the level adjusting section 308 so as to become equal to that of the transmission signal, and the phase of the feedback signal is adjusted by the phase adjusting section 309 so as to become equal to that of the transmission signal. The output signal (transmission signal) of the digital modulating means 301 is input to the level adjusting section 308 and the phase adjusting section 309. The level adjusting section 308 and the phase adjusting section 309 perform the processing of <Formula 3> to <Formulae 6>. The functions included in the carrier leak detecting means 80 of the first embodiment have been clarified above.

The I/Q gain ratio detecting section 310 detects a current I/Q gain ratio from the transmission signal and the feedback signal. The I/Q gain ratio correction control section 311 calculates a correction value from the detection value calculated by the I/Q gain ratio detecting section 310 and sets the correction value in the I/Q gain ratio correcting section 302.

An I/Q gain imbalance is detected by calculating a ratio between average amplitude values of I-phase and Q-phase components of a signal.

Each average amplitude value is calculated by cumulatively adding square values of each of I-phase data and Q-phase data. If there is no I/Q gain imbalance, a detected I/Q gain ratio (ratio between average amplitude values) becomes 1 because average amplitude values of I-phase and the Q-phase components are the same because of the randomness of a W-CDMA signal. On the other hand, if there remains an I/Q gain imbalance, a detected I/Q gain ratio has a value that is deviated from 1. In the conventional detection method, an I/Q gain ratio is calculated from feedback data. However, where an I/Q gain ratio is detected from only feedback data, if the carrier frequency is set at a particular frequency such as 0 MHz, there may occur a case that the average amplitude ratio does not become 1 even in the transmission side that is considered free of an I/Q gain imbalance. This is a state that a transmission signal includes an error. If an I/Q gain ratio is detected only from feedback data that originates from such data, a value that is deviated from an optimum value is calculated and the I/Q gain ratio correction value varies and does not converge to an optimum point.

In view of the above, according to <Formula 10>, <Formula 11>, and <Formula 12>, square values of each of I-phase data and Q-phase data are added cumulatively on the transmission side as well as on the feedback side and an I/Q gain ratio calculated on the feedback side is divided by an I/Q gain ratio calculated on the transmission side. As a result, an error component that may occur depending on a carrier frequency set can be removed and an I/Q gain ratio can be detected correctly.

< Formula 10 >

$$\alpha_{RX} = \frac{\sqrt{\sum RxI^2}}{\sqrt{\sum RxQ^2}} \qquad \text{Formula 10}$$

where
  $\alpha_{RX}$: I/Q gain ratio of the feedback signal;
  RxI: I-phase component of the feedback signal; and
  RxQ: Q-phase component of the feedback signal.
  It is noted that RxI and RxQ are the same as AcprxI'(t) and AcprxQ'(t) of <Formulae 6>, respectively.

< Formula 11 >

$$\alpha_{TX} = \frac{\sqrt{\sum TxI^2}}{\sqrt{\sum TxQ^2}} \qquad \text{Formula 11}$$

where
  $\alpha_{TX}$: I/Q gain ratio of the transmission signal;
  TxI: I-phase component of the transmission signal; and
  TxQ: Q-phase component of the transmission signal.
  The samples cumulatively added in <Formula 10> and those cumulatively added in <Formula 11> correspond to each other in time and are the same in number.

< Formula 12 >

$$\alpha_{RX/TX} = \frac{\alpha_{RX}}{\alpha_{TX}} \qquad \text{Formula 12}$$

where
  $\alpha_{RX/TX}$: detected I/Q gain ratio.

To follow a variation in I/Q gain ratio due to a variation with age or a temperature variation or to reduce a correction variation due to influence of noise or the number of bits of the A/D converter, the I/Q gain ratio is corrected stepwise by multiplying the detected I/Q gain ratio by a coefficient that is smaller than 1 according to <Formula 13> and <Formula 14>. However, the correction variation becomes large if the multiplication coefficient is close to 1, and the convergence time becomes unduly long if the multiplication coefficient is too small. Therefore, the multiplication coefficient should be set at a maximum value within such a range that convergence is made without a large variation.

Formula 13:

$$\alpha = (1-\mu) + \mu(\alpha_{RX/TX}) \qquad \text{<Formula 13>}$$

where
  $\alpha$: current update amount; and
  $\mu$: update coefficient ($0 < \mu \leq 1$).

Formula 14:

$$G'_{I/Q} = G_{I/Q} \times \alpha \qquad \text{<Formula 14>}$$

where
  $G'_{I/Q}$: current I/Q gain ratio correction value; and
  $G_{I/Q}$: preceding I/Q gain ratio correction value.

Figure 14:
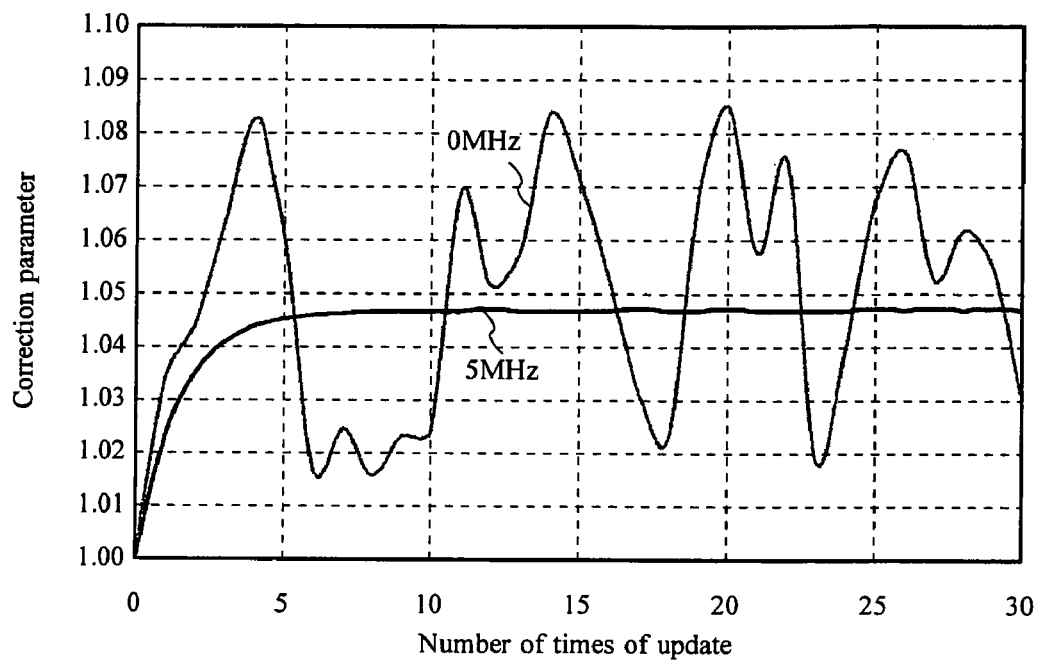
FIG. 14 shows a simulation result of convergence of a conventional I/Q gain ratio correction.
Figure 15:
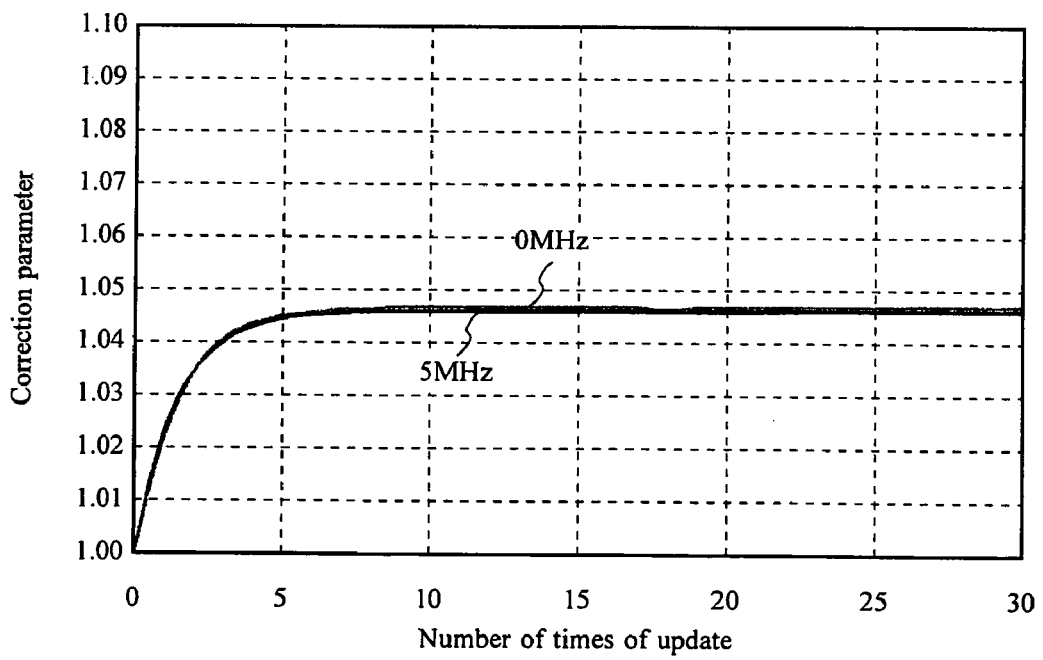
FIG. 15 shows a simulation result of convergence of an I/Q gain ratio correction in the fourth embodiment.

FIG. 14 shows a simulation result of convergence of a conventional I/Q gain ratio correction which detects an I/Q gain ratio only from a feedback signal. FIG. 15 shows a simulation result of convergence of an I/Q gain ratio correction of the technique according to the embodiment which detects an I/Q gain ratio from a transmission signal and a feedback signal. In each graph, the horizontal axis represents the number of times of update and the vertical axis represents the correction parameter value.

As seen from comparison between FIGS. 14 and 15, when the carrier frequency set is 5 MHz, the two techniques are equivalent in correction variation and the number of times of update that is necessary for convergence. On the other hand, when the carrier frequency set is 0 MHz, whereas a large variation occurs in the conventional technique, in the technique according to the embodiment convergence is made to the same I/Q gain ratio correction value as in the case that the carrier frequency set is 5 MHz. This verifies that the technique according to the embodiment makes it possible to perform an I/Q gain ratio correction stably with high accuracy independently of the input signal frequency.

As described above, in particular, the embodiment can reduce the amount of calculation because in calculating an update amount $\alpha$ for an I/Q gain ratio correction value $G_{I/Q}$ the update amount $\alpha$ is made close to 1 through multiplication by an update coefficient rather than use of such a function as an nth-root function.

Embodiment 5

A transmitter of a wireless communications apparatus according to this embodiment is the same in block configuration as the transmitter of FIG. 3 except that in this embodiment the carrier leak compensating means 2 is replaced by an orthogonality deviation corrector 2, the carrier leak detecting means 80 is replaced by an orthogonality deviation detecting means 80, and the carrier leak compensation value control means 9 is replaced by an orthogonality deviation control means 9. In this embodiment, for convenience of description, the same reference symbols as used in FIG. 3 will be used.

The digital modulating means 1 performs digital quadrature modulation on N-channel baseband signals (N≧1) of W-CDMA or the like to desired carrier frequency bands and performs multicarrier composing. And the digital modulating means 1 outputs resulting digital quadrature modulated signals TxI(x) and TxQ(t).

According to <Formulae 15>, the orthogonality deviation corrector (orthogonality deviation correcting means) 2 produces signals a(t) and b(t) that are given orthogonality deviation components that are opposite in phase to an orthogonality deviation distortion from the digital quadrature signals TxI(x) and TxQ(t) that have been produced by the digital modulating means 1 through the conversion to the IF band.

Figure 16:
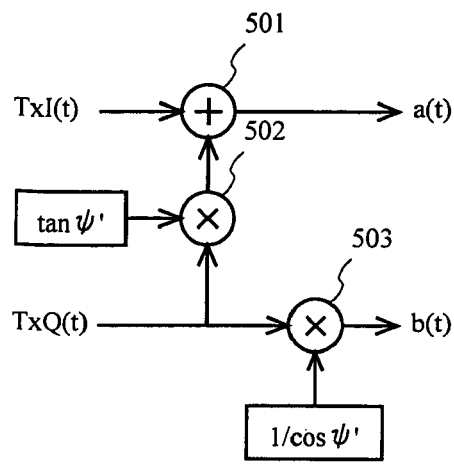
FIG. 16 shows an example configuration of an orthogonality deviation corrector according to a fifth embodiment.

FIG. 16 shows an example configuration of the orthogonality deviation corrector 2. A multiplier 502 multiplies TxQ(t) by tan ψ' and an adder 501 adds a multiplication result to TxI(t). An addition result is a(t). A multiplier 503 multiplies TxQ(t) by 1/cos ψ'. A multiplication result is b(t).

Formulae 15:

$$a(t) = TxI(t) + \tan \psi' \cdot TxQ(t)$$

$$b(t) = (1/\cos \psi') \cdot TxQ(t) \qquad \text{<Formulae 15>}$$

The output signals a(t) and b(t) as I and Q components of the orthogonality deviation corrector 2 are converted into analog signals by the D/A converter 3.

The analog quadrature modulator 4 performs analog quadrature modulation on the analog signals that are output from the D/A converter 3 and thereby performs frequency conversion to a desired RF band.

Figure 17:
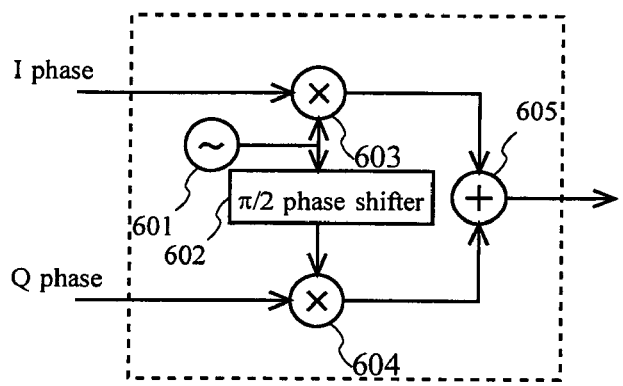
FIG. 17 shows an example configuration of an analog quadrature modulator.

FIG. 17 shows an example configuration of the analog quadrature modulator 4. A signal generated by an oscillator 601 is input to an I-phase-side multiplier 603 and is also input to a Q-phase-side multiplier 604 after being shifted in phase by 90° (π/2) by a π/2 phase shifter 602. The multiplier 603 multiplies an I-phase signal and the oscillation signal together, and the multiplier 604 multiplies a Q-phase signal and the π/2-shifted oscillation signal together. An adder 605 adds two multiplication results together, and an addition result is output as an analog modulated wave (analog quadrature modulated signal).

The frequency converting means (e.g., image suppression mixer) 5 converts part of the RF-band analog modulated wave that is output from the analog quadrature modulator 4 to an IF band (feedback signal).

The A/D converter 6 converts the IF output signal of the frequency converting means 5 into a digital signal.

The digital quadrature detecting means (e.g., digital quadrature detector) 7 quadrature-detects the digital signal that is output from the A/D converter 6 and outputs a result as feedback signals I(t) and Q(t). Then, level adjustment processing for equalizing the amplitude of the feedback signal to that of the transmission signal and phase adjustment processing for equalizing the phase of the feedback signal to that of the transmission signal are performed in the same manner as in the first to fourth embodiments. As a result, feedback signals RxI(t) and RxQ(t) are obtained.

The orthogonality deviation detecting means 80 detects an orthogonality deviation between the transmission signals TxI(t) and TxQ(t) and an orthogonality deviation between the feedback signals RxI(t) and RxQ(t) according to <Formulae 16>, calculates a difference sin φ between the two orthogonality deviations according to <Formula 17>, and outputs a result as an orthogonality deviation detection value.

< Formulae 16 >

$$\sin \phi_{TX} = \frac{\sum (TxI(t) \times TxQ(t))}{\sqrt{\sum TxI^2(t) \sum TxQ^2(t)}} \qquad \text{Formulae 16}$$

$$\sin \phi_{RX} = \frac{\sum (RxI(t) \times RxQ(t))}{\sqrt{\sum RxI^2(t) \sum RxQ^2(t)}}$$

Formula 17:

$$\sin \phi = \sin \phi_{RX} - \sin \phi_{TX} \qquad \text{Formula 17>}$$

Since a detection error value included in the feedback signal is eliminated by subtracting the orthogonality deviation detection error value sin $\phi_{TX}$ of the transmission signal from the orthogonality deviation detection error value sin $\phi_{RX}$ of the feedback signal according to <Formula 17>, an orthogonality deviation can be detected accurately even in the case where the relationship f1+f2=0 (f1≠f2) is satisfied where f1 and f2 are within the transmission signal frequency band (in this case, the conventional technique cannot detect the orthogonality deviation accurately).

The orthogonality deviation control means 9 multiplies, by a coefficient μ (0<μ≦1), the orthogonality deviation detection parameter sin φ that is output from the orthogonality deviation detecting means 80. The coefficient μ has an effect of reducing the detection error component from the one included in the detection value sin φ. As μ becomes closer to 0, the influence of the error component can be made smaller and a converging state can be maintained more stably but the distortion converging speed is made lower. Conversely, as μ becomes closer to 1, the parameter μ sin φ becomes more prone to the influence of the error component but the distortion converging speed is made higher. A μ value that is most suitable for the apparatus should be selected.

The orthogonality deviation control means 9 adds the orthogonality deviation correction parameter value μ sin φ to a preceding orthogonality deviation correction parameter value sin ψ, and outputs a resulting, current orthogonality deviation correction parameter sin ψ' (see <Formula 18>). Furthermore, to set the correction parameter sin ψ' in the orthogonality deviation corrector 2, the orthogonality deviation control means 9 converts sin ψ' according to <Formulae 19>.

Formula 18:

$$\sin \psi' = \sin \psi + \mu \sin \phi \qquad \text{<Formula 18>}$$

< Formulae 19 >

-continued $$\frac{1}{\cos\psi'} = \frac{1}{\sqrt{1-\sin^2\psi'}}$$ Formulae 19

$$\tan\psi' = \sin\psi' \times \frac{1}{\cos\psi'}$$

Figure 18:
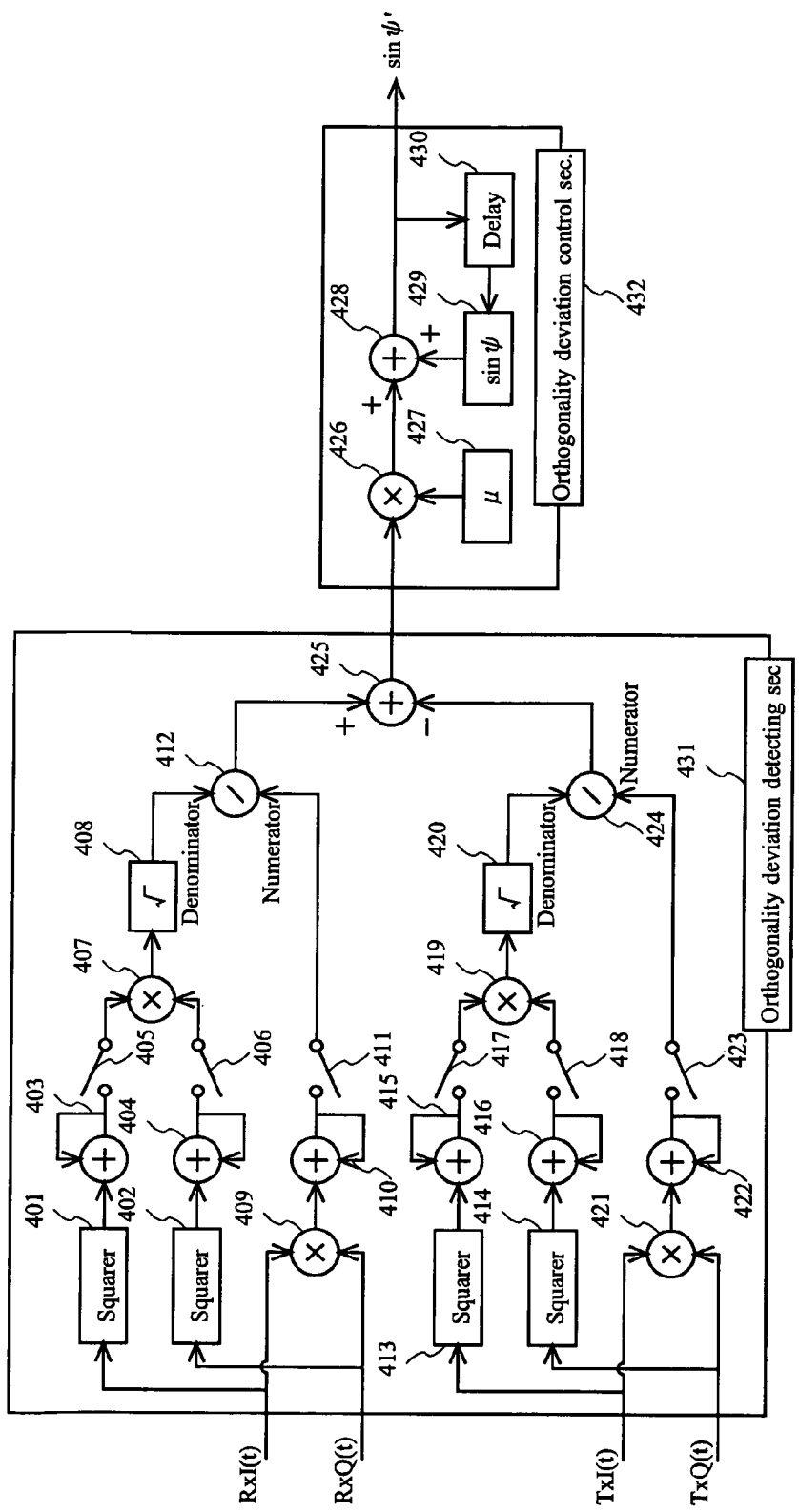
FIG. 18 shows an example configuration of an orthogonality deviation detecting section and an orthogonality deviation control section.

FIG. 18 shows an example block configuration of the orthogonality deviation detecting means 80 (in FIG. 18, an orthogonality deviation detecting section 431) and the orthogonality deviation control means 9 (in FIG. 18, an orthogonality deviation control section 432).

Figure 19:
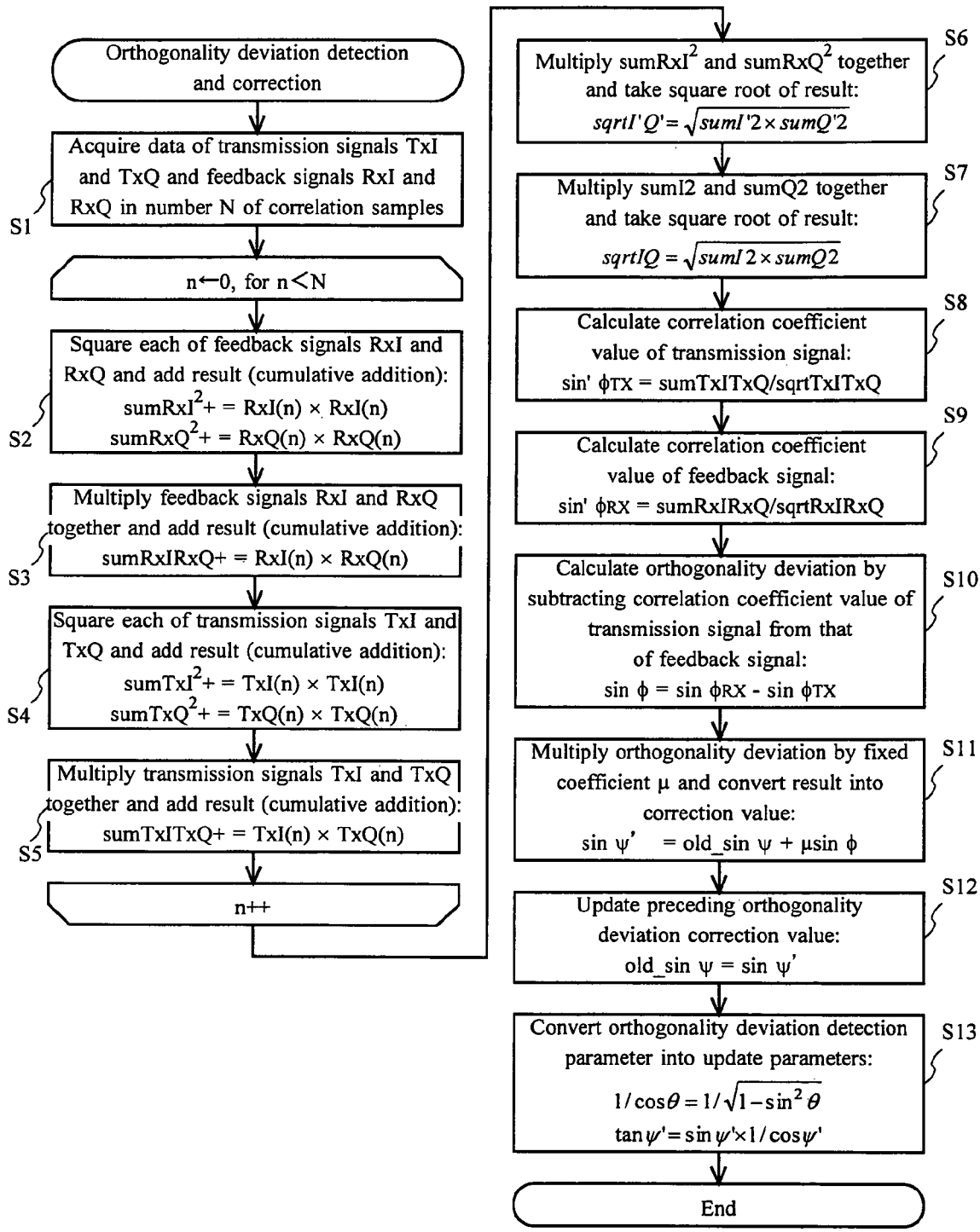
FIG. 19 is a flowchart showing an example process executed by the orthogonality deviation detecting section and control section.
Figures 20, 21:
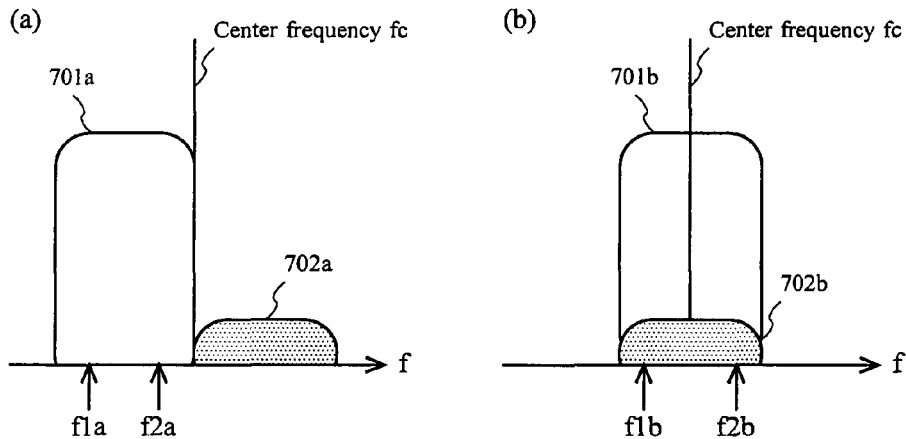
FIG. 20 shows example relationships between a transmission signal carrier frequency and a band where a distortion occurs due to an orthogonality deviation.
FIG. 21 shows example relationships between the orthogonality deviation detection value and the number of cumulative addition samples.

An example process that is executed by this block configuration will be described below with reference to FIG. 19.

Digital transmission signals TxI(t) and TxQ(t) and feedback signals RxI(t) and RxQ(t) are input to the orthogonality deviation detecting section 431 (step S1). Data of each of these signals are acquired in the number N of correlation samples.

Steps S2-S5 are executed until the number n of processed samples reaches the number N of correlation samples (n increases from 1).

More specifically, at step S2, squarers 401 and 402 square the feedback signals RxI(t) and RxQ(t) and output results RxI$^2$(t) and RxQ$^2$(t), respectively. A cumulative adder 403 cumulatively adds the specified number of samples of RxI$^2$(t) and outputs a cumulative addition value $\Sigma$RxI$^2$(t), and a cumulative adder 404 cumulatively adds the specified number of samples of RxQ$^2$(t) and outputs a cumulative addition value $\Sigma$RxQ$^2$(t). And switches 405 and 406 are closed (step S2).

After the switches 405 and 406 have been closed, a multiplier 407 multiplies the cumulative addition values $\Sigma$RxI$^2$(t) and $\Sigma$RxQ$^2$(t) together and outputs a multiplication output value $\Sigma$RxI$^2$(t)×$\Sigma$RxQ$^2$(t). A square rooter 408 takes its square root and outputs sqrt($\Sigma$RxI$^2$(t)×$\Sigma$RxQ$^2$(t)) (step S6).

Symbol "sqrt" means square root.

At step S3, a multiplier 409 multiplies the feedback signals RxI(t) and RxQ(t) together and outputs a multiplication result RxI(t)×RxQ(t). A cumulative adder 410 cumulatively adds the specified number of samples of the multiplication value RxI(t)×RxQ(t) that are output from the multiplier 409, and outputs a result $\Sigma$(RxI(t)×RxQ(t)) (step S3). And a switch 411 is closed.

A divider 412 divides the output value $\Sigma$(RxI(t)×RxQ(t)) of the cumulative adder 410 by the output value sqrt($\Sigma$RxI$^2$(t)×$\Sigma$RxQ$^2$(t)) of the square rooter 408 and outputs an orthogonality deviation detection value sin $\phi_{RX}$ in the second equation of <Formulae 16> (step 9).

At step S4, as in the above-described processing of detecting an orthogonality deviation between the feedback signals RxI(t) and RxQ(t) (in this case, step S2), squarers 413 and 414 and cumulative adders 415 and 416 produce cumulative addition values $\Sigma$TxI$^2$(t) and $\Sigma$TxQ$^2$(t), corresponding to the specified number of samples, of the transmission signals TxI (t) and TxQ(t). And switches 417 and 418 are closed (step S4).

After the switches 417 and 418 have been closed, a multiplier 419 multiplies the cumulative addition values $\Sigma$TxI$^2$(t) and $\Sigma$TxQ$^2$(t) together and outputs a multiplication output value $\Sigma$TxI$^2$(t)×$\Sigma$TxQ$^2$(t). A square rooter 420 takes its square root and outputs sqrt($\Sigma$TxI$^2$(t)×$\Sigma$TxQ$^2$(t)) (step S7).

At step S5, as in the above-described processing of detecting an orthogonality deviation between the feedback signals RxI(t) and RxQ(t) (in this case, step S3), a multiplier 421 and a cumulative adder 422 produce cumulative addition value $\Sigma$(TxI(t)×TxQ(t)), corresponding to the specified number of samples, of the transmission signals TxI(t) and TxQ(t) (step S5). And a switch 423 is closed.

A divider 424 divides the output value $\Sigma$(TxI(t)×TxQ(t)) of the cumulative adder 422 by the output value sqrt($\Sigma$TxI$^2$(t)×$\Sigma$TxQ$^2$(t)) of the square rooter 420 and outputs an orthogonality deviation detection value sin $\phi_{TX}$ in the first equation of <Formulae 16> (step 8).

An adder 425 subtracts the orthogonality deviation detection value sin $\phi_{TX}$ of the transmission signal from the orthogonality deviation detection value sin $\phi_{RX}$ of the feedback signal and outputs a subtraction result, that is, an orthogonality deviation detection parameter sin $\phi$, to the orthogonality deviation control section 432 (step S10).

A multiplier 426 multiplies, by a coefficient $\mu$ (0<$\mu$≦1), the orthogonality deviation detection parameter sin $\phi$ that is input to the orthogonality deviation control section 432. An adder 428 adds a preceding orthogonality deviation correction parameter sin $\psi$ to the multiplication value $\mu$ sin $\phi$ that is output from the multiplier 426, and outputs an addition result as an orthogonality deviation correction parameter sin $\psi'$ (step S11). As a result, the preceding orthogonality deviation correction parameter sin $\psi$ is updated to the current orthogonality deviation correction parameter sin $\psi'$ (step S12).

The coefficients $\mu$ and sin $\psi$ are output via memories of coefficient sections 427 and 429, respectively. The parameter sin $\psi$ is obtained by delaying sin $\psi'$ by a time corresponding to one update with a delay element 430.

To set, in the orthogonality deviation corrector 2, orthogonality deviation correction values corresponding to the thus-obtained current correction parameter sin $\psi'$, sin $\psi'$ is converted according to <Formulae 19> (step S13). More specifically, orthogonality deviation correction values tan $\psi'$ and 1/cos $\psi'$ that correspond to sin $\psi'$ are set in the orthogonality deviation corrector 2.

The update parameters, which are obtained in the above manner, are set sequentially as update values in the orthogonality deviation corrector 2. This makes it possible to detect and correct an orthogonality deviation accurately even during operation.

Advantages of the wireless communications apparatus which employs the orthogonality deviation detection and control according to the embodiment will be described with reference to FIG. 23.

Figure 23:
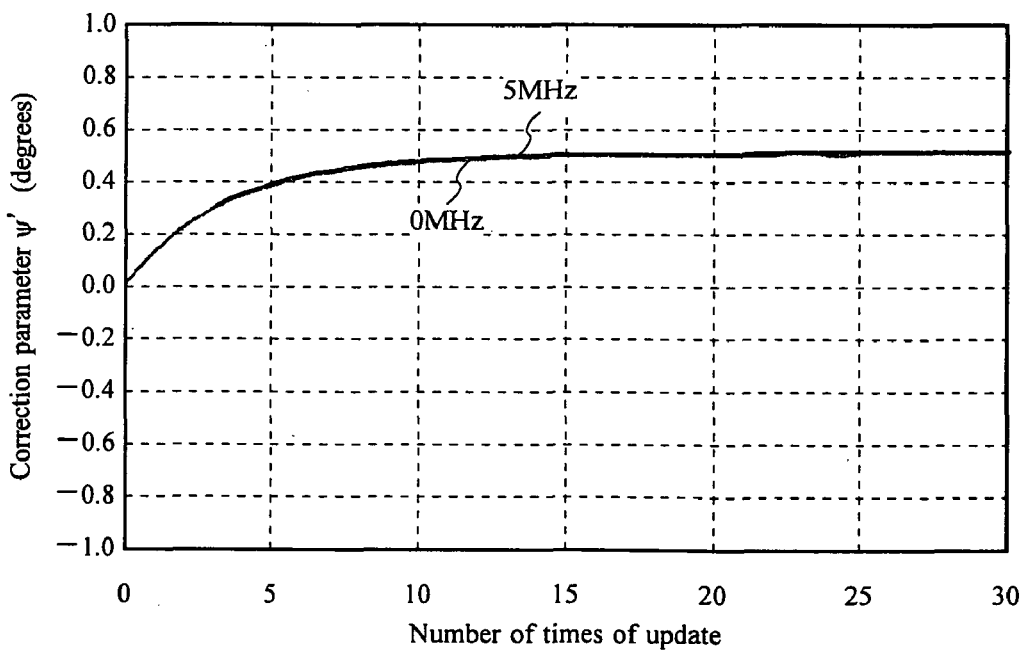
FIG. 23 shows example relationships between the correction parameter and the number of times of update in a wireless communications apparatus according to a fifth embodiment.

FIG. 23 shows example relationships between the correction parameter and the number of times of update in the wireless communications apparatus according to the embodiment. This example shows how the correction parameter $\psi'$ varies in the case where the transmission signal is a W-CDMA signal (single carrier) and the carrier frequency is 0 MHz (frequencies f1a and f2a that satisfy a relationship f1a+f2a=0 exist in the carrier frequency band) or 5.0 MHz (frequencies f1a and f2a that satisfy the relationship f1a+f2a=0 do not exist in the carrier frequency band). The number of cumulative addition samples was set at 16,384, the coefficient $\mu$ was set at ¼, and the orthogonality deviation occurring in the analog quadrature modulator was set at 0.5°.

In the graph of FIG. 23, the horizontal axis represents the number of times of update and the vertical axis represents the correction parameter $\psi'$ (degrees).

Figure 22:
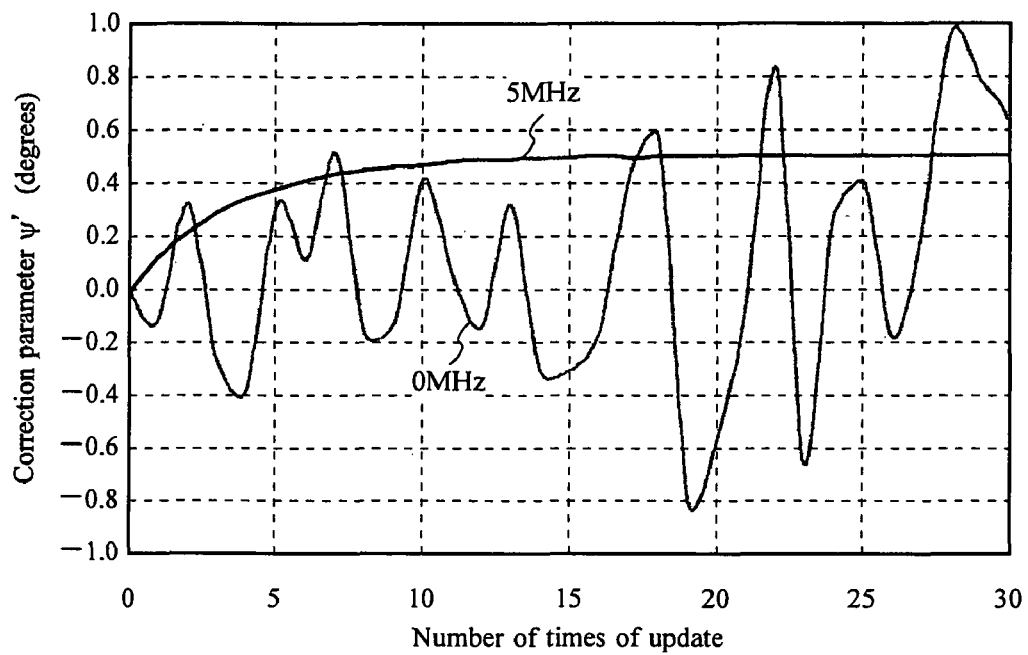
FIG. 22 shows example relationships between the correction parameter and the number of times of update in a conventional wireless communications apparatus.

It is seen from FIG. 23 that the correction parameter $\psi'$ converges to 0.5° as the number of times of update increases in the case where the transmission signal is of 5 MHz. Also in the case where the transmission signal is of 0 MHz, the correction parameter $\omega'$ converges to 0.5° as the number of times of update increases. It is thus understood from these results that the correction parameter ψ', which varies in FIG. 22 (conventional technique), can be detected and corrected correctly in the embodiment.

As described above, the embodiment makes it possible to detect and correct an orthogonality deviation with high accuracy even in the case where arbitrary frequencies f1 and f2 that satisfy a relationship f1+f2=0 (f1≠f2) exist in the frequency band of a transmission signal.

As described above, this embodiment provides the following transmitter:

A transmitter comprising:

a digital modulating means (e.g., digital quadrature modulator) for digital-quadrature-modulating input digital baseband signals of N channels (N: an integer that is greater than or equal to 1) to desired carrier frequencies and performing multicarrier composing;

an orthogonality deviation corrector for performing an orthogonality deviation correction on an IF signal that is output from the digital modulating means;

a D/A converter for converting a digital corrected signal that is output from the orthogonality deviation corrector into an analog signal;

an analog quadrature modulator for quadrature-modulating the analog signal that is output from the D/A converter and thereby frequency-converting it to a desired RF band;

a frequency converting means for frequency-converting part of an output signal of the analog quadrature modulator as a feedback signal to an IF band;

an A/D converter for converting an output signal of the frequency converting means into a digital signal;

a digital quadrature detecting means for digital-quadrature-detecting the digital signal that is output from the A/D converter, and generating digital I and Q signals;

an orthogonality deviation detecting means for detecting an orthogonality deviation from quadrature-detected feedback signals RxI(t) and RxQ(t) and transmission signals. TxI(t) and TxQ(t); and an orthogonality deviation control means for updating correction parameter values set in the orthogonality deviation corrector on the basis of an orthogonality deviation detection value detected by the orthogonality deviation detecting means.

In one example configuration, the transmitter is equipped with an orthogonality deviation corrector which outputs orthogonality deviation compensation signals of <Formulae 15> in which ψ is an orthogonality deviation correction parameter value for the IF signals TxI(t) and TxQ(t) generated through multicarrier composing by the digital modulating means.

In another example configuration, the transmitter is equipped with an orthogonality deviation detecting means which detects an orthogonality deviation according to <Formulae 16> and <Formula 17> using, as input signals, the IF signals TxI(t) and TxQ(t) and the feedback signals RxI(t) and RxQ(t).

In a further example configuration, the transmitter is equipped with an orthogonality deviation control means which determines, according to <Formula 18>, an orthogonality deviation correction parameter sin ψ based on which to set a value newly in the orthogonality deviation corrector, and sets values obtained according to <Formulae 19> in the orthogonality deviation corrector.

Embodiment 6

For example, a transmitter may be provided with certain two of the above-described carrier leak (DC offset) detecting and correcting function of the first to third embodiments, the above-described I/Q gain ratio detecting and correcting function of the fourth embodiment, and the above-described orthogonality deviation detecting and correcting function of the fifth embodiment. As a preferable form, a transmitter may be provided with these three functions.

As a specific example, it is possible to mix all or part of the carrier leak detecting means 800 and the carrier leak compensation value control means 9 shown in FIG. 11 (third embodiment), the level adjusting section 308, the phase adjusting section 309, the I/Q gain ratio detecting section 310, and the I/Q gain ratio correction control section 311 shown in FIG. 12 (fourth embodiment), and the orthogonality deviation detecting means 80 and the orthogonality deviation control means 9 shown in FIG. 3 (fifth embodiment). In this case, the detecting function and the control function may be separated from each other and all functions may be mixed together.

It is also possible to mix all or part of the carrier leak compensating means 2 shown in FIGS. 3, 4, and 11 (first to third embodiments), the I/Q gain ratio correcting section 302 shown in FIG. 12 (fourth embodiment), and the orthogonality deviation corrector 2 shown in FIG. 3 (fifth embodiment). For example, the circuit shown in FIG. 13 for correcting an I/Q gain ratio (fourth embodiment), the circuit shown in FIG. 16 for correcting an orthogonality deviation (fifth embodiment), and a circuit for adding carrier leak compensation values in the first to third embodiments to an I-phase signal and a Q-phase signal of a transmission signal, respectively, may be disposed in series (in any of various orders) to construct a circuit that performs all of these corrections. Each of these corrections can be realized by affine transformation, for example.

INDUSTRIAL APPLICABILITY

The transmitter and the carrier leak detection method according to the invention make it possible to detect a carrier leak stably with high accuracy for every carrier frequency setting by detecting a carrier leak using a transmission signal in addition to a feedback signal. Furthermore, the use of the cumulative adding means which cumulatively add values of signal components at a higher speed than a chip rate makes it possible to shorten the time that is taken by the carrier leak compensation value to converge.

The transmitter according to the invention makes it possible to detect an I/Q gain ratio stably with high accuracy for every carrier frequency setting by detecting an I/Q gain ratio using a transmission signal in addition to a feedback signal.

The transmitter according to the invention makes it possible to detect an orthogonality deviation stably with high accuracy for every carrier frequency setting by detecting an orthogonality deviation using a transmission signal in addition to a feedback signal.

Furthermore, the invention makes it possible to effectively detect and correct a distortion occurring in a transmission signal due to a carrier leak, an I/Q gain imbalance, or an orthogonality deviation for every carrier frequency setting by performing two or more of the carrier leak compensation, the I/Q gain imbalance compensation, and the orthogonality deviation compensation (in a preferable form, all of the three kinds of compensation).

The invention claimed is:

1. A transmitter which transmits a multicarrier signal obtained by combining one or plural modulated carriers, comprising:

carrier leak compensating means for adding carrier leak compensation values corresponding to an I phase and a Q phase, respectively, to a received multicarrier signal and outputting a resulting signal;

an analog quadrature modulator for up-converting the output signal of the carrier leak compensating means to a radio frequency;

feedback means for receiving and quadrature-detecting part of an output signal of the analog quadrature modulator and outputting a feedback signal in which carrier frequencies are substantially the same as those of said multicarrier signal;

carrier leak detecting means for detecting an I-phase carrier leak and a Q-phase carrier leak of an amplitude/phase-adjusted feedback signal and the multicarrier signal on the basis of a difference between cumulative addition values, calculated in the same period, of the amplitude/phase-adjusted feedback signal and the multicarrier signal; and carrier leak compensation value control means for determining carrier leak compensation values to be set newly in the carrier leak compensating means on the basis of the detected carrier leaks.

2. A transmitter comprising:

digital modulating means for combining one or plural input digital baseband signals after subjecting them to bandwidth limitation, up-sampling, and digital quadrature modulation to corresponding carrier frequencies and outputting a resulting multicarrier signal in a first intermediate frequency band;

carrier leak compensating means for adding carrier leak compensation values corresponding to an I phase and a Q phase, respectively, to the multicarrier signal and outputting a resulting signal;

a D/A converter for converting an output of the carrier leak compensating means into an analog signal;

an analog quadrature modulator for converting the output signal of the D/A converter into a real signal and up-converting it to a radio frequency;

frequency converting means for receiving part of an output of the analog quadrature modulator and down-converting it to a second intermediate frequency band;

an A/D converter for converting an output of the frequency converting means into a digital signal;

digital quadrature detecting means for quadrature-detecting the output signal of the A/D converter so that the carrier frequencies become equal to those set in the first intermediate frequency band by the digital modulating means and generating a feedback signal having an I-phase component and a Q-phase component;

transmission signal cumulative adding means for cumulatively adding a prescribed number of samples of the multicarrier signal for each of the I-phase component and the Q-phase component;

feedback signal cumulative adding means for cumulatively adding samples, corresponding in number to the cumulative addition samples of the multicarrier signal, of the feedback signal for each of the I-phase component and the Q-phase component;

carrier leak detecting means for determining an amplitude ratio by calculating a square root of a ratio of average power values of the multicarrier signal and the feedback signal, determining a phase difference by calculating a complex correlation coefficient between the multicarrier signal and the feedback signal, determining differences between cumulative addition values, calculated by the feedback means, of the feedback signal and those of the multicarrier signal after equalizing an amplitude and a phase of the former to those of the latter on the basis of the amplitude ratio and the phase difference, and detecting carrier leak components on the basis of the differences, by running a program; and carrier leak compensation value control means for updating the carrier leak compensation values by adding carrier leak detection values multiplied by a positive number that is smaller than or equal to 1 to carrier leak compensation values currently set in the carrier leak compensating means.

3. A carrier leak detecting method comprising the steps of:

calculating a cumulative addition value of signal samples obtained through sampling and quadrature detection for each of an I phase and a Q phase in a predetermined sampling interval at a rate that is higher than or equal to a chip rate and lower than or equal to a sampling rate;

detecting an amplitude ratio to and a phase difference from a reference signal on the basis of samples that is smaller in number than samples that should be obtained in the sampling interval for the cumulative addition; and detecting carrier leak components on the basis of results obtained by adjusting an amplitude and a phase of the cumulative addition values using the amplitude ratio and the phase difference.

4. A transmitter which transmits a multicarrier signal obtained by combining one or plural modulated carriers, comprising:

I/Q gain ratio correcting means for performing operations that are based on I/Q gain ratio correction values of an I phase and a Q phase on a received multicarrier signal and outputting a resulting signal;

a D/A converter for converting the output of the I/Q gain ratio correcting means into an analog signal;

an analog quadrature modulator for up-converting the output signal of the D/A converter to a radio frequency;

feedback means for receiving and quadrature-detecting part of an output signal of the analog quadrature modulator and outputting a feedback signal in which carrier frequencies are substantially the same as those of said multicarrier signal;

I/Q gain ratio detecting means for detecting an I/Q gain ratio on the basis of a ratio between I/Q gain ratios of an amplitude/phase-adjusted feedback signal and the multicarrier signal on the basis of a difference between cumulative addition values, calculated in the same period, of the amplitude/phase-adjusted feedback signal and the multicarrier signal; and I/Q gain ratio correction value control means for determining I/Q gain ratio correction values to be set newly in the I/Q gain ratio correcting means on the basis of the detected I/Q gain ratio.

5. A transmitter which transmits a multicarrier signal obtained by combining one or plural modulated carriers, comprising:

orthogonality deviation correcting means for performing operations that are based on orthogonality deviation correction values of an I phase and a Q phase on a received multicarrier signal and outputting a resulting signal;

an analog quadrature modulator for up-converting the output signal of the orthogonality deviation correcting means to a radio frequency;

feedback means for receiving and quadrature-detecting part of an output signal of the analog quadrature modulator and outputting a feedback signal in which carrier frequencies are substantially the same as those of said multicarrier signal;

orthogonality deviation detecting means for detecting an orthogonality deviation on the basis of a difference between orthogonality deviations of the feedback signal and the multicarrier signal on the basis of a difference between cumulative addition values, calculated in the same period, of the feedback signal and the multicarrier signal; and orthogonality deviation correction value control means for determining orthogonality deviation correction values to be set newly in the orthogonality deviation correcting means on the basis of the detected orthogonality deviation.

* * * * *